(12) United States Patent
Shimizu et al.

(10) Patent No.: US 6,706,961 B2
(45) Date of Patent: Mar. 16, 2004

(54) PHOTOVOLTAIC DEVICE AND PROCESS FOR THE PRODUCTION THEREOF

(75) Inventors: Koichi Shimizu, Kyoto (JP); Tsutomu Murakami, Nara (JP); Kouji Tsuzuki, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/870,790

(22) Filed: Jun. 1, 2001

(65) Prior Publication Data

US 2002/0139415 A1 Oct. 3, 2002

(30) Foreign Application Priority Data

Jun. 1, 2000 (JP) ......................................... 2000-163913

(51) Int. Cl.$^7$ ........................... H01L 31/05; H01L 31/04; H01L 31/18
(52) U.S. Cl. ............................ 136/256; 438/98; 438/83; 438/612; 257/431
(58) Field of Search .......................... 136/256; 438/98, 438/83, 612; 257/431

(56) References Cited

U.S. PATENT DOCUMENTS

| | | | |
|---|---|---|---|
| 4,260,429 A | | 4/1981 | Moyer ......................... 136/256 |
| 5,084,107 A | * | 1/1992 | Deguchi et al. ............. 136/256 |
| 5,428,249 A | * | 6/1995 | Sawayama et al. ......... 257/746 |
| 5,474,621 A | * | 12/1995 | Barnard ....................... 136/256 |
| 5,681,402 A | * | 10/1997 | Ichinose et al. ............. 136/256 |
| 5,759,291 A | * | 6/1998 | Ichinose et al. ............. 136/256 |
| 5,942,048 A | * | 8/1999 | Fujisaki et al. .............. 136/256 |
| 6,008,451 A | * | 12/1999 | Ichinose et al. ............. 136/256 |
| 6,051,778 A | | 4/2000 | Ichinose et al. ............. 136/256 |
| 6,515,218 B1 | * | 2/2003 | Shimizu et al. ............. 136/256 |
| 6,586,270 B2 | * | 7/2003 | Tsuzuki et al. ................ 438/57 |
| 2003/0019518 A1 | * | 1/2003 | Shimizu et al. ............. 136/256 |

FOREIGN PATENT DOCUMENTS

| JP | 8-97161 | 4/1996 |
|---|---|---|
| JP | 8-236796 | 9/1996 |

* cited by examiner

Primary Examiner—Alan Diamond
(74) Attorney, Agent, or Firm—Fitzpatrick, Cella, Harper & Scinto

(57) ABSTRACT

A photovoltaic device having a first electrode comprising a metallic wire, a second electrode connected to the first electrode, and a joint portion composed of conductive particles and a resin. The joint portion is arranged between the metallic wire constituting the first electrode and the second electrode. A volume density of the conductive particles in the joint is decreased in a direction from a surface of the second electrode to a surface of the metallic wire constituting the first electrode.

15 Claims, 13 Drawing Sheets

A-A' CROSS SECTION

F I G. 2
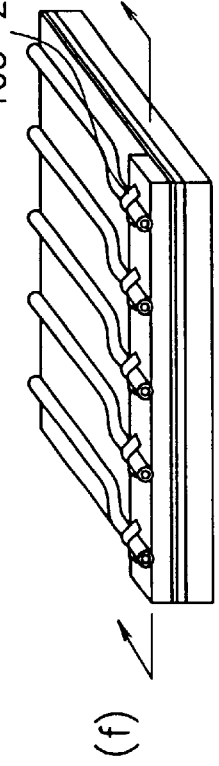
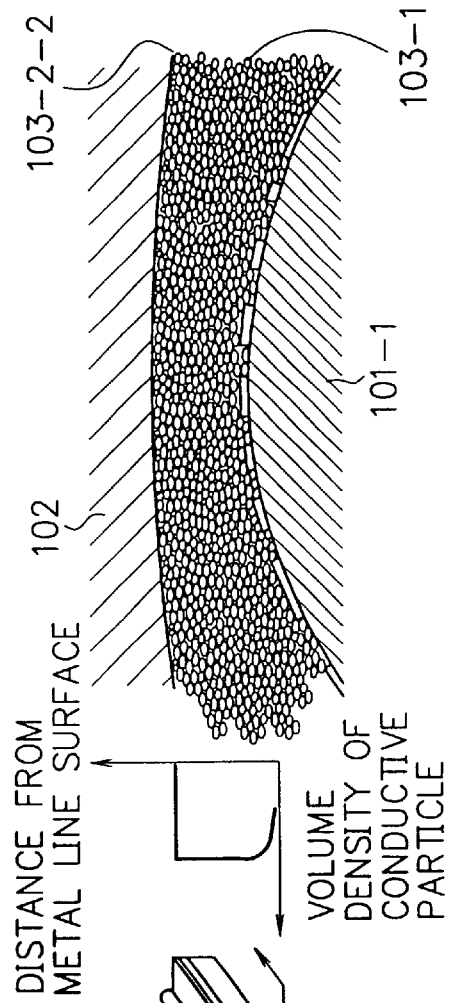

A-A' CROSS SECTION

FIG. 14
(a) 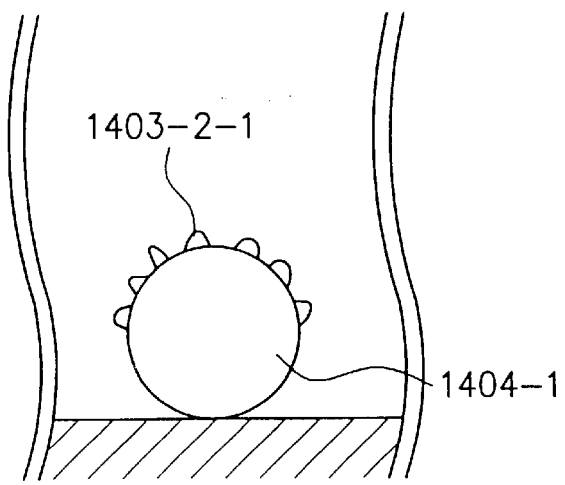
(b) 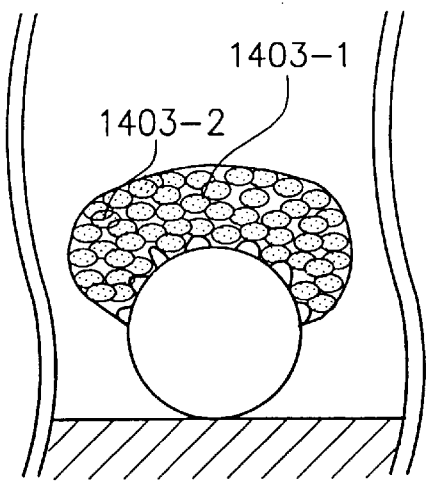
(c) 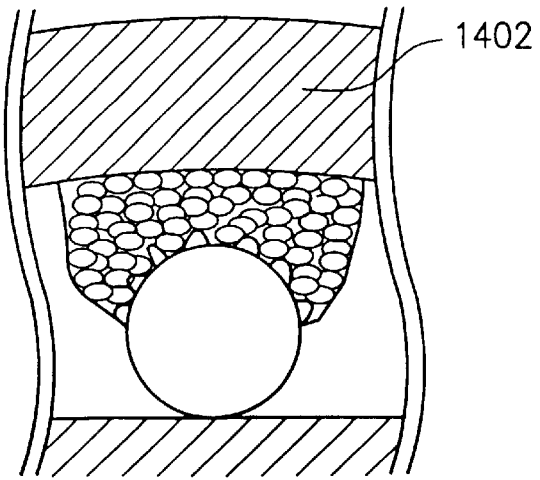

FIG. 15
(a)
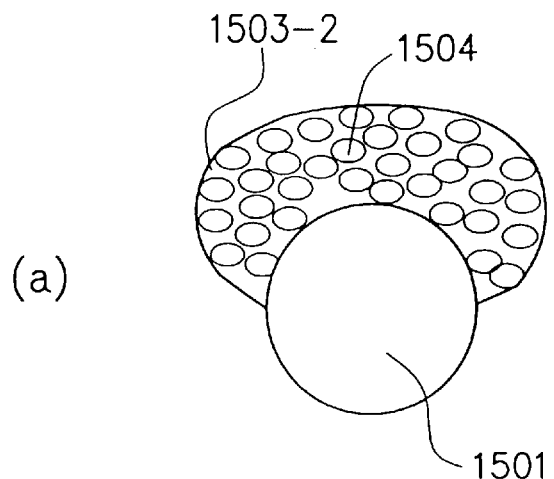
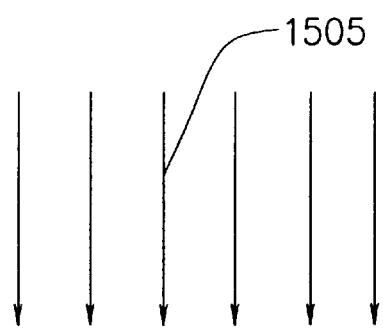
(b)
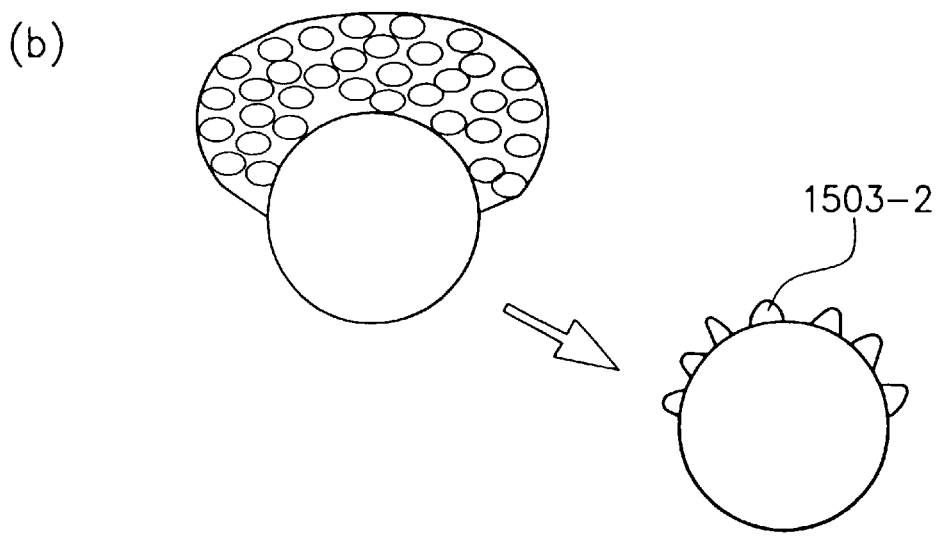

F I G. 16
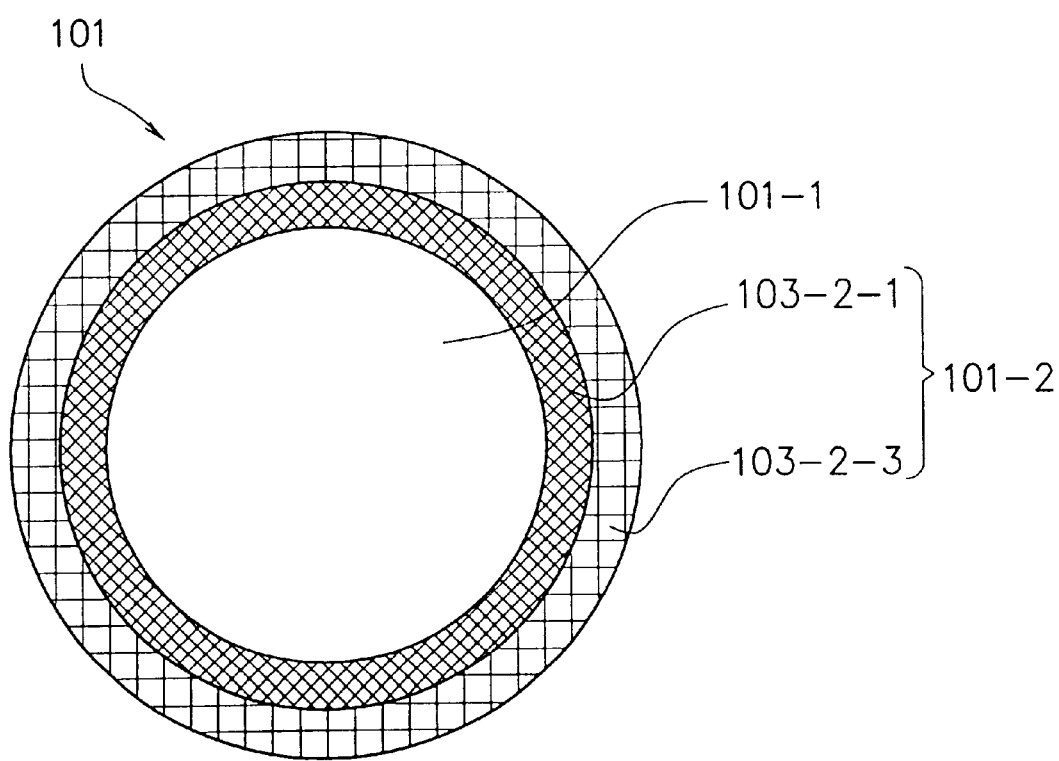

PHOTOVOLTAIC DEVICE AND PROCESS FOR THE PRODUCTION THEREOF

BACKGROUND OF THE INVENTION

1. Field of the Invention

The present invention relates to a photovoltaic device (or a photovoltaic element) such as a solar cell and a process for the production thereof. More particularly, the present invention relates to a photovoltaic device (a photovoltaic element) having an electrode structure with improved durability and a process for the production thereof.

2. Related Background Art

In recent years, power generation means utilizing various kinds of natural energies have received public attention from the viewpoint of environmental protection. In particular, attention has been focused on a sunlight power generation system which generates electric power by irradiating sunlight to photovoltaic elements (or solar cells) without causing pollution.

However, such sunlight power generation system still have a subject necessary to be solved in order to make use thereof to be widespread such that the initial cost required for establishing a sunlight power generation system using photovoltaic elements (solar cells) is relatively high because photovoltaic elements are costly.

In order to overcome this subject, various kinds of photovoltaic elements (solar cells) and processes for the production thereof have been proposed up till now.

In particular, there is a proposal to reduce the cost required for establishing a sunlight power generation system by making each photovoltaic element (solar cell) used therein have a large light receiving area. That is, the output voltage of one photovoltaic element (solar cell) is as low as several volts and because of this, in order to achieve a high output voltage, it is necessitated that a plurality of photovoltaic elements (solar cells) are serialized. There are known several methods for serializing a plurality of photovoltaic elements (solar cells) in order to make it possible to reduce the cost of the sunlight power generation system. One of these methods is to diminish the number of photovoltaic elements (solar cells) serialized by enlarging the light receiving area of each photovoltaic element. Particularly, this method is intended to reduce the cost of the sunlight power generation system by enlarging the light receiving area of each of the photovoltaic elements used therein as large as possible to diminish the number of the photovoltaic elements to be serialized as well as the production process of the sunlight power generation system is simplified.

A feature of such large area photovoltaic element (solar cell) is to have an electrode structure on the light incident side in that a metallic wire is used.

FIG. 8 is a schematic view illustrating an example of a photovoltaic element (a solar cell) having a relatively large light receiving area. In FIG. 8, reference numeral 810 indicates a collecting electrode (or a grid electrode) comprising a plurality of metallic wires, 811 a bus bar electrode, 807 a photovoltaic layer, 808 a transparent electrode layer, and 812 a backside electrode.

In the photovoltaic element shown in FIG. 8, a current flows by way of a path connecting the backside electrode, photovoltaic layer, transparent electrode layer, collecting electrode, and bus bar electrode. In FIG. 8, the current flowing from the transparent electrode via the collecting electrode to the bus bar electrode is indicated by an arrow. As shown in FIG. 8, the current convergently flows from the transparent electrode to the collecting electrode, followed by flowing in the bus bar electrode. It is preferred for the metallic wires as the collecting electrode to be as thinner as possible so as to prevent light incident to the photovoltaic element from being shielded by the collecting electrode.

It is easily understood from FIG. 8 that as the light receiving area of the photovoltaic element is enlarged, each of the metallic wires as the collecting electrode is made to be longer accordingly, where the quantity of current flown therein is increased. As the quantity of current flown in the collecting electrode is increased, the Joule loss of the collecting electrode is increased, and because of this, it is necessary that the electrical resistance of the collecting electrode is reduced. In the case of a photovoltaic element having a size of 10 cm square, in general, a printed electrode obtained by printing a conductive resin on the transparent electrode layer and forming a low melting point metal such as a solder thereon by a reflow process is effective to use as the collecting electrode. However, in the case of a large area photovoltaic element whose size is larger than the above photovoltaic element, when such printed electrode is used as the collecting electrode, the electrical resistance of the collecting electrode unavoidably becomes higher to increase the Joule loss. In order avoid this situation, there is considered a manner to thicken the printed electrode.

However, this manner is not effective for the following reason. It is difficult to thicken the printed electrode in the longitudinal direction and therefore, the remaining solution is to thicken the printed electrode in the width direction. This entails a problem in that the printed electrode thickened in the width direction shields incident light, where the quantity of power generated is lowered. Accordingly, for a large area photovoltaic element, it is necessitated to use a collecting electrode comprising a plurality of metallic wires having a low electrical resistance which less shields the incident light. By the way, such metallic wire is thin in the width direction but is thicker than the printed electrode in the longitudinal direction. Therefore, the use of the metallic wire makes it possible to realize a collecting electrode which is thin and is low in electrical resistance.

U.S. Pat. No. 4,260,429 discloses a photovoltaic element in which a metallic wire is used the collecting electrode.

Besides, in order to establish an electrical connection of a collecting electrode comprising a metallic wire and a bus bar electrode in an electrode structure of a photovoltaic element, there are know a method of joining the metallic wire with the bus bar electrode by direct welding or fusing, and a method of joining the metallic wire with the bus bar electrode through a low melting metal represented by a solder or through a conductive resin.

Now, in the electrode structure of a photovoltaic element as disclosed in U.S. Pat. No. 4,260,429, the electrical connection portion between the metallic wire and the bus bar electrode is very important factor in view of the following factors.

1. The electrical connection portion is necessary to be low in electrical resistance. As above described, a current convergently flows in the collecting electrode, where a large current flows also in a portion of the electrical connection portion which located at the leading end of the collecting electrode. To sufficiently suppress the Joule loss generated by the flow of such a large current, the electrical resistance of the electrical connection portion is necessitated to be sufficiently low.

2. The electrical connection portion is necessary to be high in stress resistance. A photovoltaic element (a solar cell) is used in an outdoor environment. In this, although the photovoltaic element is used by configuring as a solar cell module, a relatively large stress is applied to the photovoltaic element itself due to wind or snow cover. The stress applied to the collecting electrode is liable to be concentrated at the electrical connection portion thereof with the bus bar electrode. Accordingly, the stress resistance of the electrical connection portion is necessitated to be sufficiently large.

3. The electrical connection portion is necessary to have sufficient durability so that the electrical connection portion is maintained in a stable state over a long period of time without deteriorating its low electrical resistance and large stress resistance.

Now, when calculation is made on the basis of the present power cost, it will take about ten and several years to compensate the initial cost of a conventional sunlight power generation system by the amount provided by the generated power energies. Accordingly, the durability of the photovoltaic element is required to be as long as twice or more that of any other general electronic elements. Further, since the sunlight power generation system is directly exposed to an outdoor environment, the durability thereof is actually required to be as long as about ten times the durability of any other general electronic elements.

In order for the electrical connection portion to satisfy the three performances described in the above 1 to 3 in good balance, it is preferred to be configured such that the metallic wire as the collecting electrode and the bus bar electrode are joined through a conductive resin, for the following reason. When the metallic wire and the bus bar electrode are joined by direct welding or fusing or they are joined through a low melting metal such as a solder, the rigidity of the joint (the electrical connection portion) between the metallic wire and the bus bar electrode becomes excessively high, so that stress is concentrated at a portion of the metallic wire situated in the vicinity of the joint (the electrical connection portion) to increase the possibility that the metallic wire is broken.

An example of the conventional joint structure (the conventional electrical connection structure) in that the metallic wire as the collecting electrode and the bus bar electrode are joined through a conductive resin is disclosed in Japanese Laid-open Patent Application No. Hei 8-236796. A cross-sectional structure of the electrical connection portion described in this document is typically as shown in FIG. 10.

As shown FIG. 10, a metallic wire 1001-1 (cross-section of the metallic wire) is electrically and mechanically joined with an electrode member 1002 through a joint composed of a resin 1003-2 and a number of conductive particles 1003-1. The concrete size of the joint structure is as follows: the thickness of the metallic wire is in a range of about several tens to several hundreds $\mu$m; and the size of the conductive particle is about several tens nm if the conductive particle is made from carbon and is in a range of about several to ten and several $\mu$m if the conductive particle is made from a metal. Further, the joint is concretely formed by uniformly dispersing conductive particles in a resin to form a conductive resin, disposing the conductive resin between the metallic wire and the electrode member, and hardening the conductive resin.

In the joint structure (the electrical connection structure) in this case, the mechanical strength of the joint portion composed of the conductive particles and the resin is relatively weak at an interface between the joint and the metallic wire, that is, the bonded plane between the conductive resin and the surface of the metallic wire and its neighborhood. Particularly, in the stress resistance test and stress resistance durability test, peeling or breakage is sometimes occurred at the bonded plane or its neighborhood. The occurrence of peeling or breakage at the bonded plane becomes a serious problem.

Thus, there is an increased demand for improving the electrical connection portion (the join portion) in the electrode structure of the photovoltaic element (the solar cell) so that it excels in stress resistance and durability.

SUMMARY OF THE INVENTION

The present invention is aimed at solving the foregoing problems in the prior art and achieving a photovoltaic element (a solar cell) having an improved electrode structure in which a collecting electrode comprising a metallic wire and a bus bar electrode are joined through a conductive resin to form an electrical connection between the collecting electrode and the bus bar electrode which has improved stress resistance and improved durability.

Another object of the present invention is to provide a photovoltaic element having an electrode structure in which the mechanical strength of a bonded plane between a collecting electrode comprising a metallic wire and a conductive resin and its neighborhood is improved.

A further object of the present invention is to provide a photovoltaic element having a first electrode comprising a metallic wire, a second electrode connected to said first electrode, and a joint portion composed of conductive particles and a resin arranged between said metallic wire as said first electrode and said second electrode, characterized in that a volume density of said conductive particles in said joint portion is decreased in a direction from the surface of the second electrode to the surface of the metallic wire as the first electrode, whereby the joint portion has improved stress resistance.

A further object of the present invention is to provide a process for the production of said photovoltaic element. The process includes following two embodiments.

A first embodiment of the production process is characterized by including a steps of disposing a resin (A) containing conductive particles dispersed therein at a desired volume density, and a step of stacking a resin (B) on said resin (A), said resin (B) containing said conductive particles dispersed therein at a desired volume density which is different from said volume density of the conductive particles dispersed in the resin (A), thereby forming aforesaid joint portion.

A second embodiment of the production process is characterized by including a steps of forming a mottled cover portion covering the surface of the metallic wire in a mottled pattern, and a step of disposing a resin containing conductive particles dispersed therein in such a manner that the resin is in contact with the mottled cover portion. In this process, preferably, the mottled cover portion is formed by disposing a resin containing a filler on the surface of the metallic wire, and irradiating the resin containing the filler with an energy beam.

The constitution, advantages, and preferred embodiments of the present invention will be detailed with reference to the drawings later.

BRIEF DESCRIPTION OF THE DRAWINGS

FIGS. 2(f) and 2(g) are schematic views, continued from FIG. 1(e), for explaining the production steps of producing a photovoltaic element (a solar cell) in Example 1 which will be described later.

FIGS. 14(a) to 14(c) are schematic views for explaining steps of forming another example of a joint structure of the present invention.

FIGS. 15(a) and 15(b) are schematic views for explaining steps of forming a mottled c over portion in the present invention.

FIG. 16 is a schematic cross-sectional view illustrating an example of a first electrode in the present invention.

DESCRIPTION OF THE INVENTION AND PREFERRED EMBODIMENTS

Figure 1:
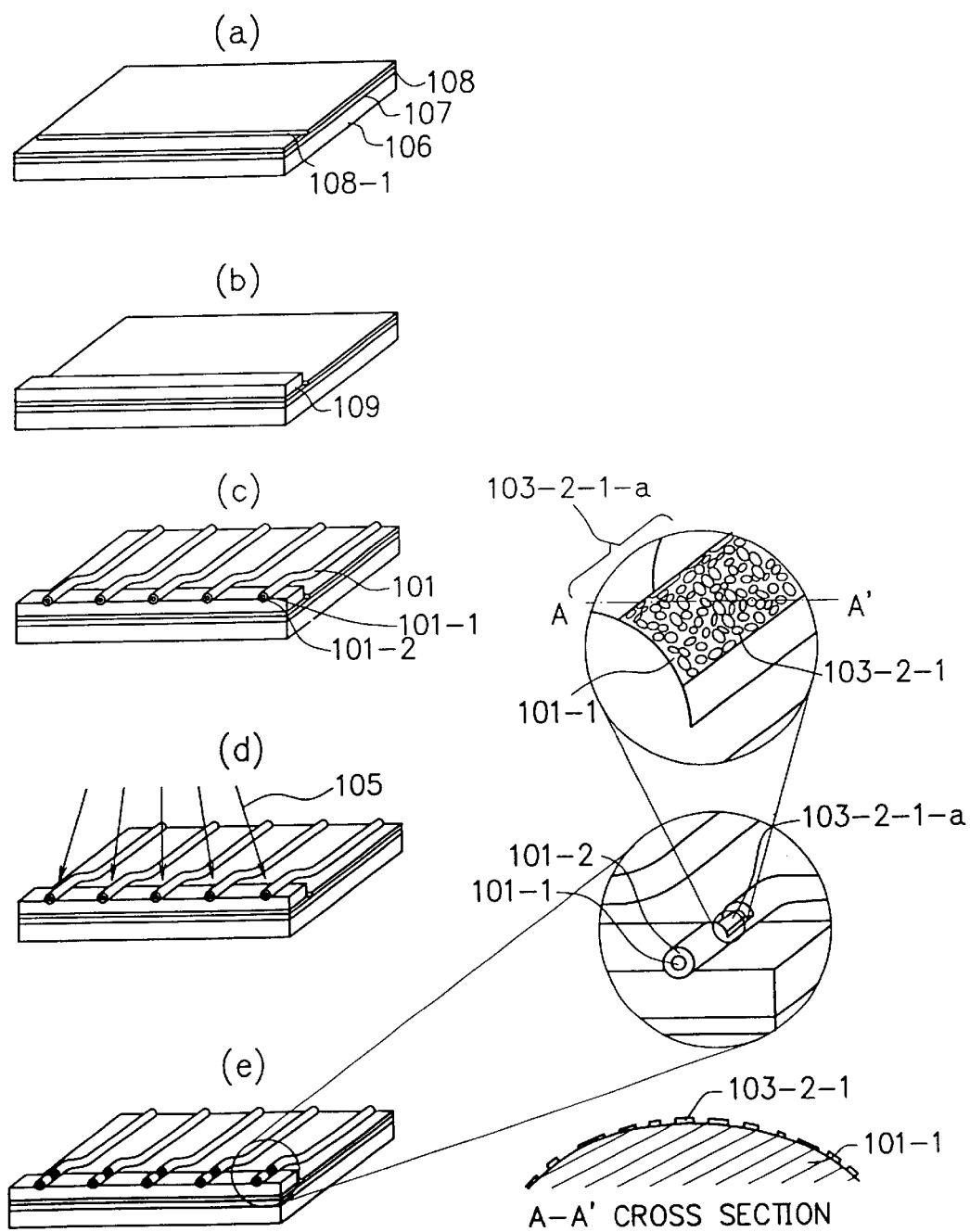
FIGS. 1(a) to 1(e) are schematic views for explaining the production steps of producing a photovoltaic element (a solar cell) in Example 1 which will be described later.

In the following, preferred embodiments of the present invention will be described while referring to the drawings.

Description will be made of a photovoltaic element of the present invention.

Figure 9:
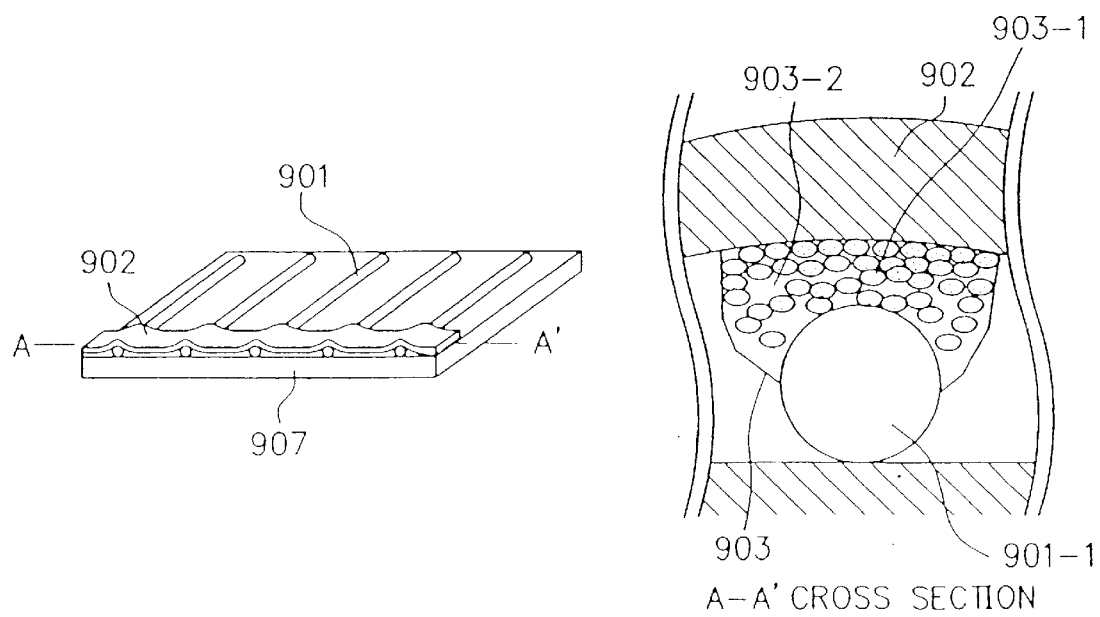
FIG. 9 is a schematic view for explaining an embodiment of the present invention.

FIG. 9 is a schematic view illustrating an example of a photovoltaic element (device) [or a solar cell] of the present invention.

In FIG. 9, a schematic configuration of the photovoltaic element is shown on the left side and a detailed structure (cross-section A—A') thereof is shown on the right side. In FIG. 9, reference numeral 901 indicates a first electrode comprising a metallic wire 901-1, reference numeral 902 a second electrode, reference numeral 903-1 a conductive particle, reference numeral 903-2 a resin, reference numeral 903 a joint portion composed of the conductive particles and the resin, and reference numeral 907 a photovoltaic layer.

The detailed structure of the joint structure shown on the right side in FIG. 9 is of a cross-section taken along the line A—A' of the photovoltaic element shown on the left side in FIG. 9, wherein the metallic wires as the first electrode 901 are jointed with the second electrode 902 through the joint portion 903.

FIG. 9 shows a typical embodiment of a photovoltaic element of the present invention. The present invention is not limited this embodiment. For example, the cross-section of the first electrode may be configured into a shape different from the circular shape shown in FIG. 9. Similarly, the cross-section of the second electrode may be configured into a shape different from the plane shape shown in FIG. 9. And the shape of the joint portion may be optionally modified to be different from that shown in FIG. 9.

The present invention has a feature in that in the joint portion 903 composed of the conductive particles and the resin, the volume density of the conductive particles is decreased so as to make the distribution of the conductive particles become coarsened, in a direction from the neighborhood of the surface of the second electrode to the neighborhood of the surface of the metallic wire.

Figure 10:
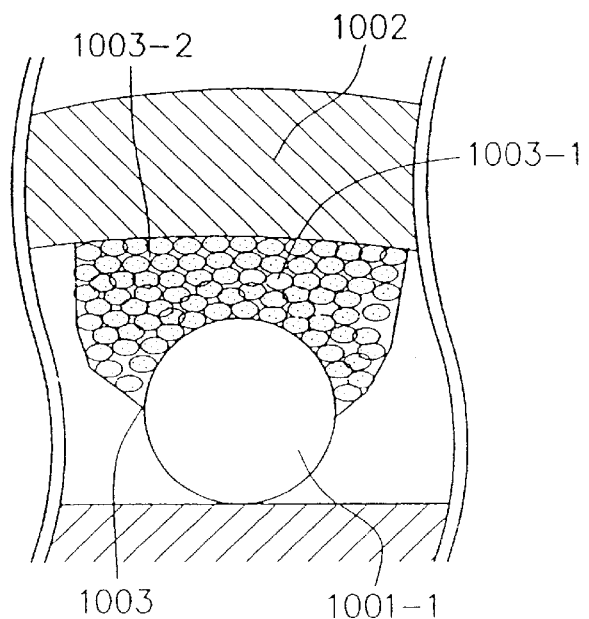
FIG. 10 is a schematic view for explaining an embodiment of a related prior art.
Figure 11:
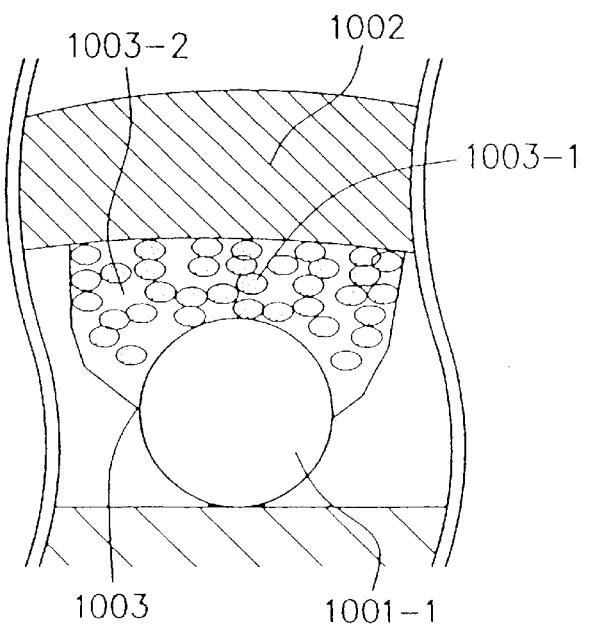
FIG. 11 is a schematic view for explaining an embodiment of another related prior art.

For comparison purposes, an example of a detailed electrode structure of a conventional photovoltaic element and an example of a detailed electrode structure of another conventional photovoltaic element are shown respectively in FIG. 10 and FIG. 11. FIG. 10 shows a case where the volume density of the conductive particles (1003-1) is relatively high. FIG. 11 shows a case where the volume density of the conductive particles (1103-1) is relatively low.

As shown in FIGS. 10 and 11, the volume density of the conductive particles (1003-1, 1103-1) contained in a joint portion (1003, 1103) is not varied but constant.

In the case where the volume density of the conductive particles is high as shown in FIG. 10, the area of a bonded portion between the metallic wire 1001-1 and the resin 1003-2 is relatively small. Accordingly, the adhesive strength of a bonded interface between the metallic wire and the joint portion 1003 is low and therefore, the metallic wire is liable to be peeled from the joint portion. Further, the amount of the conductive particles 1003-1 not contributing to retention of the structure of the joint portion is large and therefore, the strength of the joint portion itself is low, where an inner portion of the joint portion in the vicinity of the metal wire where an external stress is liable to be concentrated is susceptible to breakage.

On the other hand, in the case where the volume density of the conductive particles 1103-1 is low as shown in FIG. 11, since the amount of the resin 1103-2 is large, the area of a bonded portion between the metallic wire 1101-1 and the resin 1103-2 is relatively large. Because of this, the adhesive strength of a bonded interface between the metallic wire 1101-1 and the joint 1103 is high and therefore, the metallic wire is less peeled from the joint portion. Further, because the amount of the resin contributing to retaining the structure of the joint portion is large, the strength of the joint portion itself is higher, where an inner portion of the joint portion is less susceptible to breakage However, since the amount of the conductive particles in the joint portion is small, conductive paths formed by sequential contacts of the conductive particles become thin and long, where the electrical resistance of the joint portion becomes large.

The present invention is aimed at solving the problems of the joint portions of the conventional photovoltaic elements and achieving an improved joint portion (an improved electrical connection) having a diminished electrical resistance and an improved strength as well as increasing the adhesive strength of the bonded interface. The joint portion according to the present invention has significant advantages. That is, because the volume density of conductive particles in the joint portion is decreased so as to make the distribution of the conductive particles become coarsened, in a direction from the neighborhood of the surface of the second electrode to the neighborhood of the surface of the metallic wire, the bonded plane between the metallic wire and the resin is relatively large so that the adhesive strength at the bonded interface between the metallic wire and the joint portion is high, where the metallic wire is less peeled from the joint portion. Further, the amount of the resin of a portion of the joint portion which is situated in the vicinity of the metallic wire is relatively large and because of this, the adhesive strength of the portion of the joint portion which is situated in the vicinity of the metallic wire is high, where said portion of the joint potion is less susceptible to breakage. In addition, although the conductive paths formed by sequential contacts of the conductive particles in the joint portion have thin portions, such thin portions are of a short length therefore, the electrical resistance of the joint portion is desirably prevented from being increased.

Figure 12:
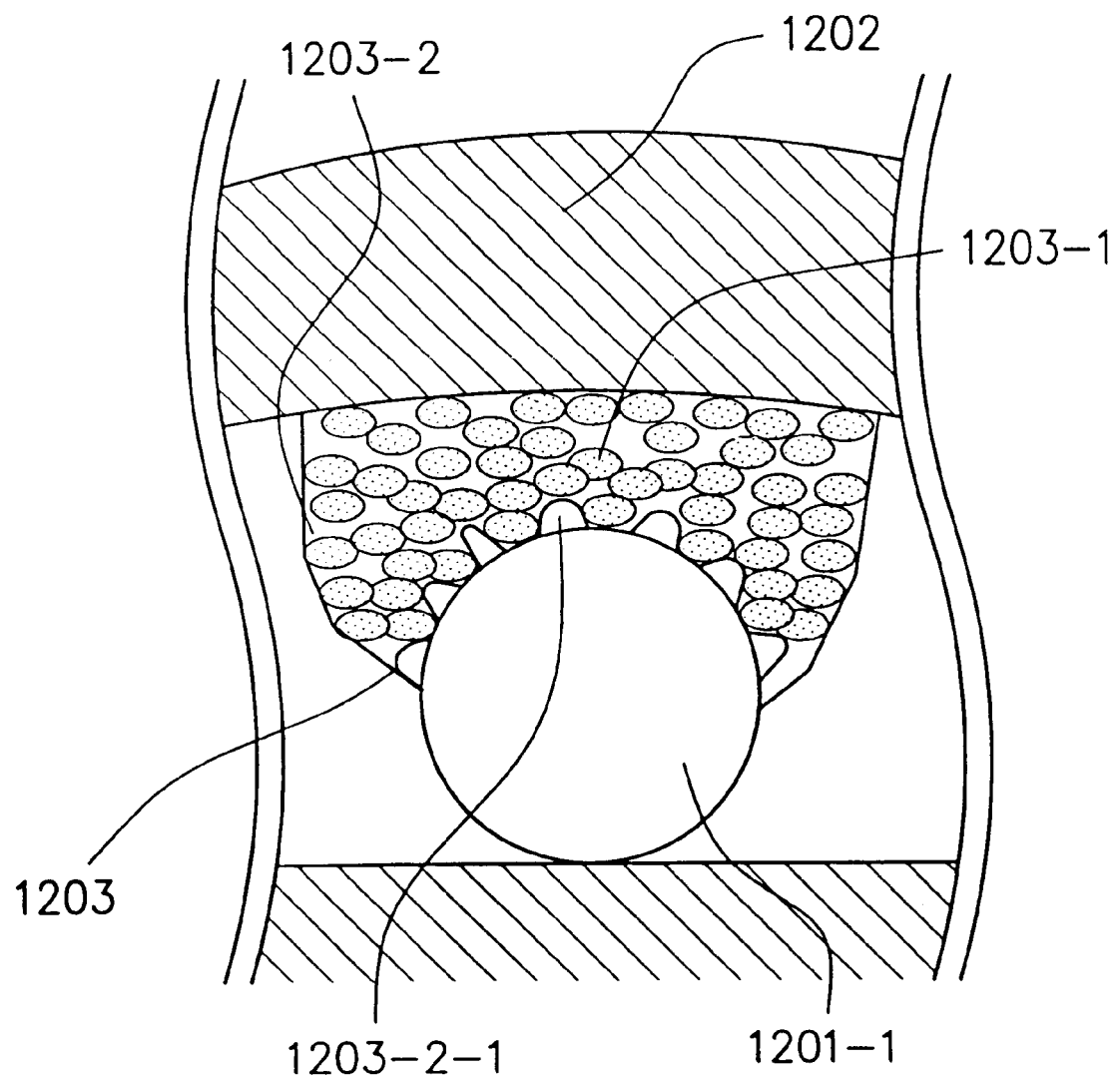
FIG. 12 is a schematic view for explaining another embodiment of the present invention.

FIG. 12 shows another example of the joint structure of the photovoltaic element of the present invention. In FIG. 12, reference numeral 1201 indicates a first electrode comprising a metallic wire 1201-1, reference numeral 1202 a second electrode, reference numeral 1203-1 a conductive particle, and reference numeral 1203 a joint portion composed of the conductive particles and the resin. Reference numeral 1203-2-1 indicates a first resin which covers the surface of the first electrode in a mottled pattern, and reference numeral 1203-2 a second resin. In this embodiment, as shown in FIG. 12, the distribution of the conductive particles 1203-1 in the second resin 1203-2 is depicted as being uniform. This is not limitative and can be modified in other appropriate way.

The first resin 1203-2-1 covers the surface of the first electrode 1201-1 in a mottled pattern. In other words, the surface of the first electrode is partially exposed from the first resin 1203-2-1. The second resin 1203-2 is bonded to or the conductive particles are brought into contact with the exposed surface spots of the first electrode, whereby the joint portion is formed. With this structure, in the joint portion composed of the resin and the conductive particles, the volume density of the conductive particles is decreased in a direction from the neighborhood of the surface of the second electrode to the neighborhood of the surface of the first electrode. Accordingly, because of the above-described situation, the adhesive strength between the joint portion and the first electrode is increased, the strength of a portion of the joint portion which is situated in the neighborhood of the first electrode is increased, and the electrical resistance of the joint portion is lowered.

The above-described joint structure has a further advantage as will be described in the following. Namely, The presence of an interface between the first resin and the second resin makes increase the stress resistance of a portion of the joint portion which is situated in the vicinity of the first electrode. The reason for this is considered such that the stress applied to the joint potion is dispersed at the interface, whereby the joint portion is made to be less susceptible to breakage. To be more specific, because of having the interface which is not flat but complicatedly curved, the stress applied to the joint portion in one direction is possibly dispersed in multi-directions. In other words, the first resin functions like anchors fixed to the metallic wire. Even if the kind of the first resin is identical to that of the second resin, the above function of the first resin appears insofar as an interface is present between the first resin and the second resin. The reason for this is considered such that the bonding structure of the resins of the same kind at the interface is different from the bonding structure of molecules in the resins of the same kind. However, in the case where the kind of the first resin is different from that of the second resin, and more specifically, a moderate difference in elastic modulus is present between the first resin and the second resin, the anchor function of the first resin becomes larger.

In particular, in the case where the first resin principally comprises a cross-linked butyral resin and the second resin principally comprises a cross-linked acrylic ester, the anchor function of the first resin becomes significantly larger.

In the following, the respective constituents of the photovoltaic element of the present invention will be detailed.
Photovoltaic Element:

The photovoltaic element (or the solar cell) functions to generate an electromotive force when it is irradiated with light. The photovoltaic element includes photovoltaic elements in which various semiconductor materials are used and other photovoltaic elements in which various pigments are used. The former photovoltaic elements can be classified, from the viewpoint of the kinds of the semiconductor materials used therein, into silicon series photovoltaic elements in which silicon-containing semiconductor materials are used and compound semiconductor series photovoltaic elements in which compound semiconductor materials represented by gallium arsenide or cadmium sulfide are used. These photovoltaic elements can be also classified, from the viewpoint of a semiconductor junction, into p-n junction type photovoltaic elements, p-i-n junction type photovoltaic elements, and Schottky barrier type photovoltaic elements. These photovoltaic elements can be classified, from the viewpoint of the crystal structure, into single crystal type photovoltaic elements, polycrystalline type photovoltaic elements, microcrystalline type photovoltaic elements, and amorphous type photovoltaic elements. These photovoltaic elements can be further classified, from the view point of the layer structure, into single cell type photovoltaic elements, tandem cell type photovoltaic elements, triple cell type photovoltaic elements, and the like.

The present invention concerns an electrode structure of such photovoltaic element. The present invention can be applied to any photovoltaic element as long as it has an electrode structure in which a metallic wire is used. The present invention is aimed chiefly at enhancing the resistance against a stress which is applied to an electrode connection portion (or an electrode joining portion) of a photovoltaic element, for example, in the process of producing a photovoltaic element, in the process of producing a module by serializing a plurality of photovoltaic elements and integrating the resultant with a protective material or in the process of producing a sunlight power generation system, or in practical use of the system outdoors. When the present invention is applied to a photovoltaic element having an electrode structure in that stress is liable to be applied to the electrode connection portion, the effect of the present invention becomes significant. In general, it is considered that as the flexibility or area of the entirety of a photovoltaic element becomes larger, stress applied to the electrode connection portion (or the electrode joining portion) becomes larger and the duration where the stress is applied becomes longer. Especially, when the present invention is applied to a photovoltaic element formed on a flexible substrate such as a SUS stainless steel plate and having a size of more than several cm square, the effect of the present invention becomes significant.
Metallic Wire:

Any wire made of a metal can be used without any particular limitation. As specific examples of such metal as the constituent of the metallic wire, there can be mentioned gold, silver, copper, tin, lead, iron, nickel, titanium, aluminum, molybdenum, tungsten, bismuth, indium, and platinum, and alloys thereof. The thickness of the metallic wire is generally in a range of several tens to several hundreds μm. The cross-sectional shape of the metallic wire may be a circular shape, a triangular shape, a square shape, or any other polygonal shape. The metallic wire may be of a multi-layered structure. That is to say, even when the metallic wire comprises a core wire and a cover formed thereon, the effect of the present invention is desirably provided. The cover formed on the core wire may be a metal cover formed by means of plating, cladding, or the like. In particular, a cover formed by silver plating is widely used.

First Electrode:

Any electrode comprising a metallic wire which is capable of transmitting a power generated in a photovoltaic element can be used without any particular limitation. The first electrode may have a cover around the metallic wire. For example, the first electrode may have a cover made of a conductive resin capable of bonding the first electrode to a photovoltaic layer. The first electrodes may be generally provided in pair on both the light incident face side and the non-light incident face side of a photovoltaic element. To prevent occurrence of a shadow, the first electrode is preferred to be thin. In the case where the metallic wire as the first electrode is thin, it is difficult to join the metallic wire with the second electrode by means of a resin containing conductive particles. Accordingly, when the present invention is applied to a photovoltaic element whose first electrode comprising a thinner metallic wire, the effect of the present invention becomes significant. Further, when the present invention is applied to a photovoltaic element having an electrode structure in that a current is converged at a connection portion between the first electrode and the second electrode, the effect of the present invention becomes more significant. Thus, the present invention is more effective to the first electrode which is provided as a connecting electrode on the light incident face side of the photovoltaic element where a current is more converged. In any case, the electrical resistance of the first electrode is preferred to low. To be more specific, the thickness of the first electrode is preferred to be in a range of several tens to several hundreds μm, and the electrical resistance thereof is preferred to be in a range of several $\Omega$/m or less per unit length, unlike the electrical resistance of a printed electrode made of a conductive resin or an electrode obtained by applying a solder on the printed electrode by a reflow process.

Second Electrode:

Any electrode made of a metal capable of transmitting a power generated in a photovoltaic element can be used as the second electrode without any particular limitation. Two second electrodes may be provided in pair on both the light incident face side and the non-light incident face side of a photovoltaic layer.

As specific examples of the metal as the constituent of the second electrodes, there can be mentioned gold, silver, copper, tin, lead, iron, nickel, titanium, aluminum, molybdenum, tungsten, bismuth, indium, and platinum, and alloys thereof. The second electrode can be used in the form of a bulk or a metal thin film formed on a substrate. In the case where the first electrode is used as a collecting electrode arranged on the light incident face side of the photovoltaic element, the second electrode is used as a bus bar electrode. The bus bar electrode functions to take up a current from the collecting electrodes and guide the current to the outside of the photovoltaic element, or to introduce a current from the external into the collecting electrode. As such bus bar electrode, it is possible to use an electrode comprising a strip of a metal foil. The thickness of the metal foil is generally in a range of several tens to several hundreds μm.

Conductive Particles:

Particles made of a material having an electric conductivity can be used without any particular limitation. As specific examples of such electrically conductive material, there can be mentioned single metals such as gold, silver, copper, tin, lead, iron, nickel, titanium, aluminum, molybdenum, tungsten, bismuth, indium, and platinum, and alloys thereof; metal oxides such as indium-tin oxide, tin oxide, and titanium oxide; and other materials such as graphite. In the case of conductive particles made of a graphite series material or a metal oxide series material, their average particle size is preferred to be in a range of several tens to several hundreds nm. In the case of conductive particles made of a metallic material, their average particle size is preferred to be in a range of several hundreds nm to several μm. The conductive particles may be of an appropriate shape such as a spherical shape, a flaky shape, or a columnar shape. In particular, the conductive particles made of a material having a higher electric conductivity are preferably used because they can increase the effect of lowering the electrical resistance of an electrode connection portion (or an electrode joining portion). Concretely, the conductive particles made of gold, silver, copper, or nickel may be preferably used. The conductive particles made of silver are the most appropriate because silver is less expensive in comparison with gold and is chemically stable. A plurality of kinds of the conductive particles being different in terms of the constituent material or average particle size may be used as a mixture if required.

Resin:

Any resin which is curable and adhesive to the metallic wire and the second electrode can be used without any particular limitation. As specific examples of such resin, there can be mentioned synthetic resins such as thermoplastic resin, thermosetting resin, elastomer, and mixtures thereof. Besides, natural organic materials such as starch, glue, rosin, asphalt, and tar are also usable. Specific examples of the thermosetting resin are epoxy resin, phenoxy resin, melamine resin, alkyd resin, phenol resin, unsaturated polyester resin, and polyurethane resin. Specific examples of the thermoplastic resins are butyral resin, polyester resin, polyimide resin, and acrylic resin. Of these, epoxy resin, urethane resin, acrylic resin, and butyral resin which exhibit a relatively high adhesive strength against the metallic wire and have a suitable elasticity are preferred. In the case where such thermosetting resin or such thermoplastic resin is used, it is effective to adjust the overall elastic modulus of the resin (comprising the thermosetting resin or the thermoplastic resin) by suitably adjusting the cross-linking density of the thermosetting resin or adjusting the mixing ratio of the thermoplastic resin.

Separately, it is possible for the resin to be incorporated with a coupling agent having good compatibility with the conductive particles, for example, such as a silane coupling against silver particles. Electrode Connection Portion (or Electrode Joining Portion):

As previously described, in the electrode connection portion (or the electrode jointing portion), the metallic wire as the first electrode and the second electrode are electrically and mechanically joined.

The joint portion comprising a solid composed of conductive particles and a resin functions to establish an electrical continuity between the metallic wire and the second electrode while bonding to both the metallic wire and the second electrode. Conductive paths are formed by sequential contacts of the conductive particles in the joint portion. The resin in the joint portion functions to bond the metallic wire to the second electrode and to retain the above conductive paths. There is no particular limitation for the joint portion as long as it exhibits the above-described functions. The electrical resistance of each conductive path is preferably made lower because the lower electrical resistance of the conductive path makes the Joule loss smaller. The adhesive strength of a bonded interface between the metallic wire and the second electrode in the joint portion is preferably made larger because the larger adhesive strength is effective to prevent the metallic wire to be peeled from the second electrode. The joint portion is preferable to have a suitable elasticity because the suitable elasticity exhibits a stress relief function. If the elasticity of the joint portion is excessively small, the metallic wire will be sometimes fatigued and broken when it receives repeated stress, whereas if the elasticity of the joint portion is excessively large, the joint portion sometimes cannot retain the conductive paths.

Volume Density of Conductive Particles:

The volume density of the conductive particles means a density of the conductive particles per unit volume in the joint portion. The term "unit volume" is defined as a unit volume being sufficiently smaller than the total volume of the joint portion and being equal to or larger than the volume of one conductive particle.

Neighborhood of Surface:

The term "neighborhood of the surface of a metallic wire" means a region from a portion being in close proximity to the surface of the metallic wire to the surface of the metallic wire, and the term "neighborhood of the surface of a second electrode" means a region from a portion being in close proximity to the surface of the second electrode to the surface of the second electrode. The distance between the surface of the metallic wire or the second electrode and the portion being in close proximity to the surface of the metallic wire or the second electrode is defined to be sufficiently smaller than the distance between the metallic wire and the second electrode.

Reduction in Volume Density of Conductive Particles:

The volume density of the conductive particles is not necessarily linearly decreased. The stepwise decrease is also effective. Further, insofar as the volume density of the conductive particles is low in the neighborhood of the metallic wire, even if the volume density of the conductive particles is uniform in the remaining region, the effect of decreasing the volume density of the conductive particles can be attained. However, if the volume density is excessively low, the electrical resistance will be undesirably increased. Accordingly, a difference between the maximum volume density and the minimum volume density is preferably in a range of less than about one-half of the maximum volume density.

Mottled Pattern:

The mottled pattern is a pattern in which the cover regions covered with the first resin and the exposed regions not covered with the first resin and perfectly exposed therefrom are alternatively present on the surface of the metallic wire. Each of the cover regions and the exposed regions is sufficiently smaller than the thickness of the metallic wire and is equal to or more than the particle size of one conductive particle.

In the following, description will be made of the process for producing a photovoltaic element in the present invention.

The production process of the present invention is carried out in accordance with two processes. The first process includes steps (1), (2) and (3). Of these steps, the steps (2) and (3) are peculiar steps according to the present invention. The first process will be described with reference to FIGS. 13(a), 13(b), and 13(c).

Figure 13:
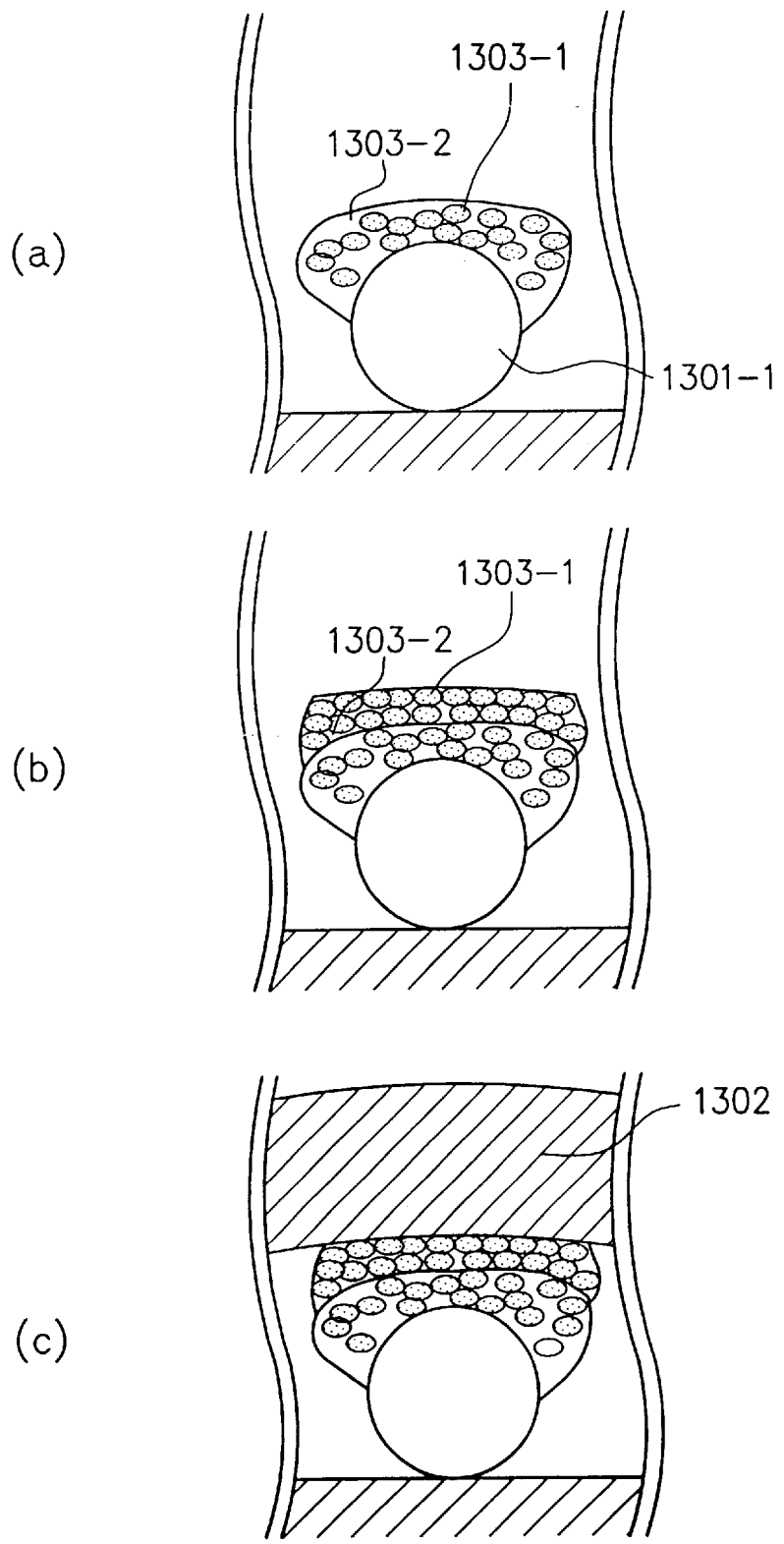
FIGS. 13(a) to 13(c) are schematic views for explaining steps of forming an example of a joint structure of the present invention.

In step (1) shown in FIG. 13(a), a resin 1303-2 in which conductive particles 1303-1 are dispersed at a specific volume density is applied on a metallic wire 1301-1 and is hardened, to form a hardened resin portion. In step (2) shown in FIG. 13(b), a resin 1303-2 in which the conductive particles 1303-1 are dispersed at a specific volume density larger than the specific volume density in step (1) is applied on the hardened resin portion. In step (3) shown in FIG. 13(c), a second electrode 1302 is disposed on the resin 1303-2, followed by hardening the second resin 1302-2, to obtain a joint portion between the metallic wire 1301-1 and the second electrode 1302.

In this way, the joint portion between the first electrode and the second electrode of the photovoltaic element of the present invention can be easily produced by preparing a plurality of kinds of resins in which conductive particles are dispersed in different volume densities and repeating the steps of applying and hardening the resins by at least one or more times. This process can be combined with a second process which will be described later. The first process can be modified such that a hardened resin portion is first formed on the second electrode and then a resin containing conductive particles at a volume density smaller than that of the conductive particles contained in the hardened resin is applied to the hardened resin portion. The kinds of the resins used in the steps (1) and (2) may be identical to or different from each other.

The second process for producing the photovoltaic element in the present invention includes the following steps (1), (2), and (3). Of these steps, the steps (1) and (2) are peculiar steps according to the present invention. The second process will be described with reference to FIGS. 14(a), 14(b), and 14(c).

In step (1) shown in FIG. 14(a), a mottled cover portion 1403-2-1 is formed on a metallic wire 1401-1 with a resin 1403-2.

In step (2) shown in FIG. 14(b), a resin 1403-2 containing conductive particles 1403-1 is applied on the mottled cover portion.

In step (3) shown in FIG. 14(c), a second electrode 1402 is disposed on the resin 1403-2, followed by hardening the resin 1403-2, to obtain a joint portion between the metallic wire 1401-1 and the second electrode 1402.

In this way, the joint between the first electrode and the second electrode of the photovoltaic element of the present invention can be easily produced by forming the mottled cover portion on the metallic wire, and applying and hardening a resin containing conductive particles. This process can be combined with the above-described first process.

The step (1) of forming the mottled cover portion on the surface of the metallic wire can be carried out by suitably spraying a resin on the surface of the metallic wire and hardening the resin; however, it can be more easily carried out by the following method. Such a method of forming the mottled cover portion will be described with reference to FIGS. 15(a) and 15(b).

(1) A resin 1503-2 containing a filler 1504 is applied on the surface of a metallic wire 1501-1 and is hardened (see FIG. 15(a)).

(2) The resin 1503-2 containing the filler 1504 is irradiated with an energy beam 1505, to remove part of the filler and the resin (see FIG. 15(b)).

In this way, the mottled cover portion can be easily formed by applying and hardening the resin containing the filler, and suitably removing part of the filler and the resin by irradiating the resin with the energy beam. According to this method, to form covered regions and exposed regions each of which is sufficiently smaller than the thickness of the metallic wire and is sufficiently larger than the size of one conductive particle as described in the paragraph of the term "Mottled Pattern", a relationship between the diameter of each of powders constituting the filler and the volume density of the powders constituting the filler becomes important. In particular, it is effective to specify the average diameter of the powedery particulates of the filler in a range of 10 to 50 nm and to specify the volume density of the powedery particulates of the filler in a range of 20 to 50%. If the volume density of the powedery particulates of the filler is less than 20%, the area of the cover regions becomes excessively large, with a result that the electrical resistance of the joint becomes excessively large. On the other hand, if the volume density of the powedery particulates of the filler is more than 50%, the area of the exposed regions becomes excessively large, with a result that the effect of forming the mottled cover portion is reduced and thereby the stress resistance of the joint portion is degraded.

The filler of a kind which allows absorption of the energy of the energy beam as much as possible may be selected. The reason for this is as follows: namely, the absorption of the energy of the energy beam in the filler causes the temperature rise of the filler, to easily cut the bonding at the interface between the resin and the filler, with a result that the filler is easier to be removed. In particularly, carbon black is preferably used as the filler. The energy beam is preferably a YAG laser beam having a wavelength of 1.06 $\mu$m. Further, the YAG laser beam is preferably a pulse laser by Q-switching oscillation. The reason for this is that since the output peak value of the pulse laser beam is as high as several kW to several tens kW and the pulse width thereof is as short as several tens nsec, it is possible to concentrate the energy at a portion to be irradiated with the beam and hence to enhance the workability. In the case of using a resin mainly containing cross-linked butyral resin as the resin containing the filler to be irradiated with the YAG laser beam, the average output of the laser beam is preferably in a range of 20 to 50 W. If the average output is less than 20 W, the filler cannot be sufficiently removed, so that the area of the cover regions in the mottled cover portion becomes large, with a result that the electrical resistance of the joint becomes large. On the contrary, if the average output is more than 50 W, the resin is excessively removed from the surface of the metallic wire, so that the area of the exposed regions in the mottled cover portion becomes large, with a result that the stress resistance of the joint is degraded.

The photovoltaic element and the production process thereof according to the present invention will be described in more detail with reference to the following examples. It should be understood that these examples are only for illustrative purposes and not intended to restrict the scope of the present invention.

EXAMPLE 1

FIGS. 1(a) to 1(e) and FIGS. 2(f) and 2(g) are schematic views illustrating steps of producing a photovoltaic element in this example. It is should be noted that FIGS. 1(a) to 2(g) correspond to the following steps (a) to (g).

Step (a):

A photovoltaic layer 107 and a transparent electrode layer 108 were produced on a substrate 106.

First, a stainless steel substrate (thickness: 150 $\mu$m) wound on a roll having a width of 36 cm was prepared. An Al layer (not shown) having a thickness of 200 nm and a ZnO layer (not shown) having a thickness of 1 $\mu$m were sequentially formed on the stainless steel substrate by a sputtering apparatus operated in according with a roll-to-roll process, to form a lower electrode. The stainless steel substrate provided with the lower electrode was put in a microwave plasma CVD apparatus, where amorphous silicon layers were sequentially deposited on the lower electrode to form a bottom semiconductor layer having a stacked structure comprising an n-type layer/an i-type layer/a p-type layer; a middle semiconductor layer having a stacked structure comprising an n-layer/an i-layer/a p-layer structure; and a top semiconductor layer having a stacked structure comprising an n-type layer/an i-type layer/a p-type layer, to form a photovoltaic layer 107 having three p-i-n junctions. An ITO film (thickness: 70 nm) as the transparent electrode layer 108 having a function serving as a reflection preventive layer was formed on the photovoltaic layer 107 at a film-forming temperature of 450° C. by means of a sputtering process.

The stainless steel substrate provided having the photovoltaic layer and the transparent electrode layer formed thereon was cut to obtain a plurality of elements having a width of 24 cm and a length of 18 cm. For each of the resultant elements, a peripheral portion having a width of 1 mm of the transparent electrode layer was removed (not shown), and a division groove 108-1 having a width of 1 mm was formed in the element-bearing substrate base at a position offset inwardly from one end of the element-bearing substrate by a width of 7 mm. An electrolytic etching process was used for removing the prescribed portion the transparent electrode layer, wherein the element-bearing substrate was dipped in a sulfuric acid solution and an electric field was applied between the element-bearing substrate and a counter electrode.

Step (b):

An insulating double-coated tape 109 was fixed on the transparent electrode layer 108. To be more specific, the insulating double-coated tape 109 was stuck on the portion positioned between the end of the element-bearing substrate 106 and the division groove 108-1 of the transparent electrode layer 108. The insulating double-coated tape 109 has a width of 7 mm and a length of 240 mm. An acrylic sticker was used as the sticker of the insulating double-coated tape 109. The thickness of the sticker on each side of the tape was set to 60 $\mu$m. The backing member of the insulating double-coated tape was configured by sticking a polyimide film having a thickness of 25 $\mu$m to a polyethylene terephthalate film having a thickness of 50 $\mu$m with the sticker of 60 $\mu$m.

Step (c):

A plurality of metallic wires 101-1 as the first electrode 101 were spacedly arranged on the transparent electrode 108 so that their end portions situated on the insulating double-coated tape 109. To be more specific, 42 metallic wires 101-1 (only five metallic wires are shown in the figure) as the first electrodes 101 were spacedly arranged on the transparent electrode 108 at an equal interval of 5.6 mm so that their end portions situated on the insulating double-coated tape 109 and the metallic wires were temporarily stuck by using a sticky tape (not shown).

The metallic wires 101-1 used as the first electrode 101 in the above step (c) were previously produced as follows.

A copper wire having a diameter of 4 to 5 mm covered by a silver foil having a thickness of 50 $\mu$m was provided as a starting material for the production of the metallic wires

101-1. The starting wire was drawn by a drawing machine, to be reshaped into a fine metallic wire having a diameter of 100 μm. The fine metallic wire of 500 g was continuously wound around a bobbin. After reshaping, the thickness of the silver foil as the cover (not shown) became 1 μm. Next, as shown in FIG. 16, a cover 101-2 comprising a first resin 103-2-1 containing a filler (not shown) and a third resin 103-2-3 was formed around the metallic wire by a roll coater generally used for producing an enamel wire, to obtain a first electrode. More specifically, the cover 101-2 has a two-layered structure comprising the inner layer 103-2-1 formed of the first resin perfectly hardened and the outer layer 103-2-3 formed of the third resin used for adhesively fixing the first electrode 101 on the photovoltaic layer.

The above-described covering of the metallic wire with the resins was carried out as follows:

First, the metallic wire was rewound from the bobbin, and oily material adhering on the surface of the metallic wire was removed with acetone. Next, the metallic wire was made to continuously pass through a treatment bath in which a felt filled with a resin (second resin) containing a filler for forming the inner layer was disposed.

Carbon black powder having an average particle size of 30±20 nm was used as the filler. The volume density of the carbon black powder was adjusted to 35%. The resin for forming the inner layer was produced by putting, in a paint shaker, the following components (the added amount of each component, based on the weight of a final mixture taken as 100): 37.1 parts by weight of the filler; 6.4 parts by weight of butyral resin, and 4.2 parts by weight of cresol resin, phenol resin, and an aromatic hydrocarbon based resin; 18 parts by weight of diol isocyanate as a hardening agent; 18 parts by weight of xylene, 12 parts by weight of diethyleneglycol monomethyl ether, and 3.6 parts by weight of cyclohexane as a solvent; and 0.7 part by weight of γ-mercaptopropyl trimethoxysilane as a coupling agent, and mixing and dispersing the components in the paint shaker.

After having passed through the treatment bath, the metallic wire was made to further pass through a bore formed in a die for removing unnecessary first resin containing the filler. The metallic wire was then made to pass through a drying furnace for perfectly hardening the first resin. At this time, the thickness of the inner layer was set to 5 μm by adjusting the feed speed of the metallic wire and the diameter of the bore formed in the die.

Next, the metallic wire covered with the inner layer was similarly made to pass through a treatment bath in which a felt filled with a resin (third resin) containing a filler for forming the outer layer was disposed.

Carbon black powder having an average particle size of 30±20 nm was used as the filler. The volume density of the carbon black powder was adjusted to 35%. The resin for forming the outer layer was produced by putting, in a paint shaker, the following components (the added amount of each component, based on the weight of a final mixture taken as 100): 34.3 parts by weight of the filler; 41 parts by weight of urethane resin and 14 parts by weight of phenoxy resin; 6 parts by weight of hydrogenated diphenylmethane diisocyanate as a hardening agent; 4 parts by weight of an aromatic based solvent; and 0.7 part by weight of γ-mercaptopropyl trimethoxysilane as a coupling agent, and mixing and dispersing the components in the paint shaker.

After having passed through the treatment bath, the metallic wire with the inner layer was made to further pass through a bore formed in a die for removing unnecessary third resin containing the filler. The metallic wire with the cover thus obtained was then made to pass through a drying furnace for semi-hardening the third resin, and was wound around a reel bobbin. At this time, the thickness of the outer layer was set to 20 μm by adjusting the feed speed of the metallic wire and the diameter of the bore formed in the die. The first electrode 101 was thus obtained.

Step (d):

A portion, fixed on the transparent electrode layer 108 via the insulating double-coated tape 109, of the first electrode 101 was irradiated with an YAG laser beam 105.

To be more specific, a portion, fixed on the transparent electrode layer 108 via the double-coated sticky tape 109, of the first electrode 101 was irradiated, from above, with the YAG laser beam 105 as follows. The YAG laser beam 105 is a laser beam modulated into a pulse beam having a high output peak value by the known Q-switching manner. The scanning was performed by changing the direction of the laser beam by a galvanometer scanner using a rotary mirror. The laser beam was focused at the first electrode through a fθ lens having a focal distance of 370 mm. The irradiation conditions of the laser beam were set as follows: the average output was set to 31 W (measured by a thermopile type measuring device); the pulse frequency was set to 12 kHz; the pulse width was set to several tens nsec; the scanning speed was set to 1200 mm/sec; and the spot diameter was set to about 100 μm. The scanning pattern was formed by arranging 34 pieces of parallel straight-lines, each having a width of 25 cm, with a pitch of 56 μm. The scanning was performed by reciprocating the above-described scanning pattern having 34 pieces of straight-lines. With this scanning pattern, a rectangular area having a length of 25 cm and a width of 2 mm was overall irradiated with the laser beam.

Step (e):

A mottled cover portion 103-2-1-$a$ was formed on the surface of the metallic wire 101-1 by irradiation of the YAG laser beam 105.

To be more specific, at the portion, irradiated with the YAG laser beam 105, of the first electrode 101, the filler (not shown), the third resin (not shown), and the first resin 103-2-1 were partially removed, whereby the mottled cover portion 103-2-1-$a$ was formed. The length of the mottled cover portion was 2 mm. A sample was prepared from part of the mottle cover portion. The sample was analyzed by an X-ray analyzer of a SEM (Scanning Electron Microscope). As a result, it was found that an X-ray ratio between the quantity of a characteristic X-ray indicating silver on the surface of the metallic wire and the quantity of a characteristic X-ray indicating the first resin 103-2-1 on the surface of the metallic wire is less than 0.1% in average. The sample was then subjected to surface analysis for measuring the distribution of a residue of the first resin 103-2-1. As a result, it was found that the cover regions in which the surface of the metallic wire is covered with the residue of the first resin 103-2-1 and the exposed regions in which the surface of the metallic wire is exposed are mixedly present on the surface side of the metallic wire. Each exposed region is a portion which has been in contact with the filler and thereby has been not in contact with the first resin. At such a region being in contact with the filler, the filler was removed by irradiation of the laser beam 105, with a result that the surface of the metallic wire was exposed. The X-ray ratio at the cover regions was about 0.2%, and the X-ray ratio at the exposed regions was less than 0.001. The area of each of the cover regions and the exposed regions was about 5 μm square. The thickness of the cover regions was about 500 nm.

Step (f):

A second resin 103-2-2 containing silver particles as the conductive particles 103-1 was applied to the mottled cover portion 103-2-1-*a*. The conductive particles have flaky shapes having an average particle size of about 5 μm. The second resin mainly contains methyl acrylate and a hardening agent. The volume density of the conductive particles in the mixture with the second resin was 85% in the state before hardening of the second resin, and 95% in the state after hardening of the second resin.

Step (g):

A second electrode 102 was joined to the metallic wires 101-1. To be more specific, the second electrode 102 was placed on the applied second resin 103-2-2. The second electrode 102 was obtained by plating a copper foil (thickness: 100 μm, length: 240 mm, width: 6 mm) with silver to a thickness of 1 μm. At this time, the second electrode 102 was pressurized from above so that it was fixed on the element-bearing substrate 106 via the insulating double-coated tape 109. The element body was entirely put in a vacuum laminating furnace, and was heated at 210° C. for 45 sec with a pressure of 1 atm applied to the upper portion of the conductor, to harden the second resin, whereby the second electrode was joined to the first electrodes. In this case, since heat and pressure were also applied to the first electrodes 101 on the transparent electrode layer 108, the above-described semi-hardened outer layer (cover) comprising the third resin containing the filler of each first electrode was thermally hardened, whereby the first electrodes were adhesively fixed to the transparent electrode layer in an effective power generation area of the photovoltaic elememt.

It is apparent that, in the joint portion thus formed between the metallic wire 101-1 of each first electrode 101 and the second electrode 102, the volume density of the conductive particles 103-1 becomes small in the neighborhood of the surface of the metallic wire as shown in the enlarged cross-section of FIG. 2(*g*).

A photovoltaic element in this example was thus obtained.

In this way, there were prepared 100 photovoltaic elements.

Evaluation

An average photoelectric conversion efficiency of the 100 photovoltaic elements at the initial stage (before application of no stress) was 10.7%.

The initial photoelectric conversion efficiency of each photovoltaic element was measured by mounting known output terminals to the positive and negative electrodes of the photovoltaic element and connecting the output terminals to a solar simulator produced by Spire Co., Ltd. The photovoltaic element was then subjected to evaluation with respect to the stress-resistance by applying repeated stress to the photovoltaic element. Concretely, stress was applied by bending the photovoltaic element into a curvature having a radius of 50 cm. The photovoltaic element was repeatedly bent clockwise and counterclockwise with the light incident face side or the reverse face side directed upwardly. The repeated cycle was set to 20 sec, and the repeated number was set to 30,000. After the application of the repeated stress, the average photoelectric conversion efficiency was measured in the same manner as that for measuring the average initial photoelectric conversion efficiency. As a result, the average photoelectric conversion efficiency of the 100 photovoltaic element after the endurance was 10.5%.

EXAMPLE 2

Figure 3:
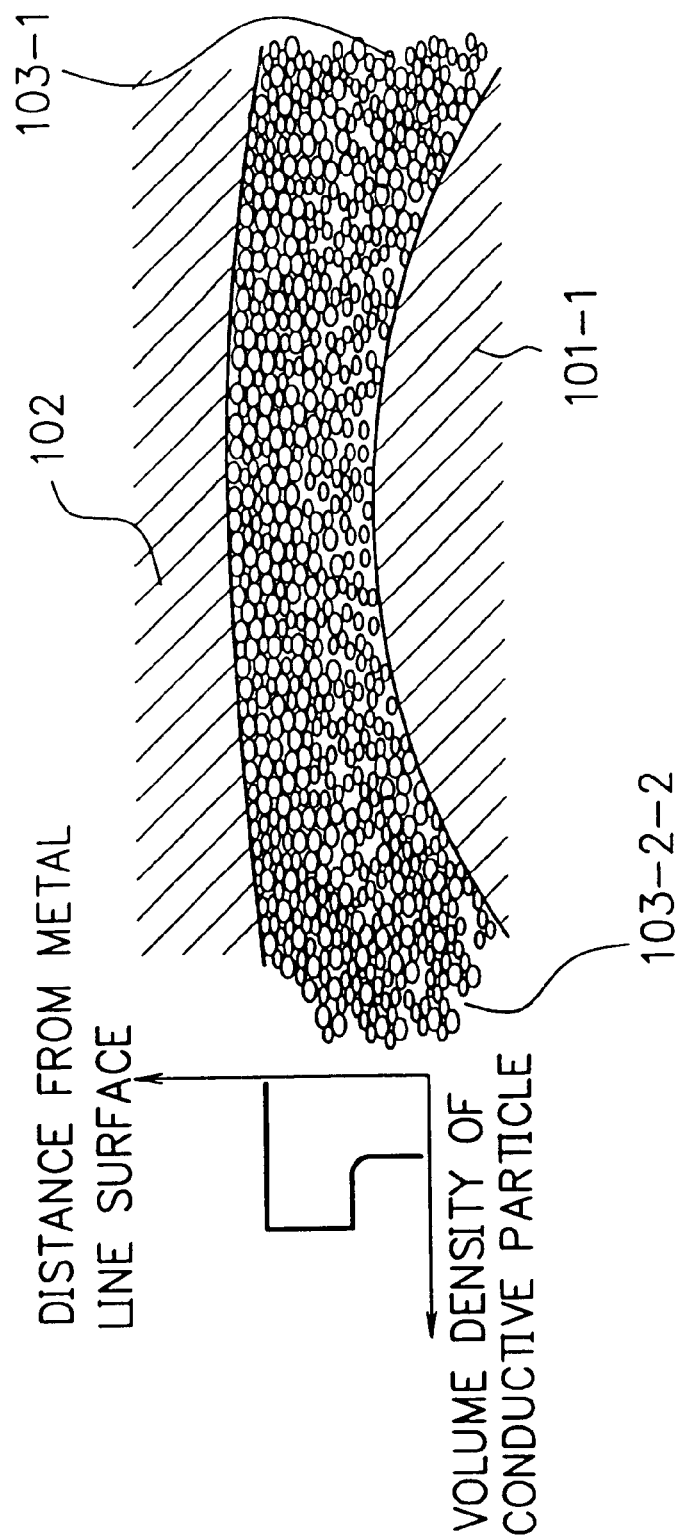
FIG. 3 is a schematic cross-sectional view illustrating an electrode structure of a photovoltaic element in Example 2 which will be described later.

FIG. 3 is a sectional view of a detailed structure of a photovoltaic element in this example. Example 2 is basically the same as Example 1 except that the output of the YAG laser was increased from 31 W to 50 W; not only the third resin but also the first resin was perfectly removed from the surface of the metallic wire 101-1, and therefore, the mottled cover portion was not formed; a resin containing low volume density silver particles (a silver paste containing low volume density silver particles as compared with silver paste containing high volume density silver particles) was applied to a portion, irradiated with the laser beam, of the first electrode and was once hardened in the same manner as that described in Example 1 without placing the second electrode 102 at the resin applied portion, and subsequently the same kind of resin containing high volume density silver particles (silver paste containing the same volume density silver particles as that described in Example 1) was applied on the hardened resin. The step of joining the second electrode 102 to the first electrodes and the steps subsequent thereto were performed in the same manner as that described in Example 1. The kind of the silver particles used here is the same as that used in Inventive Example 1, and the kind of the resin containing the silver particles used here was the same as that described in Inventive Example 1. The volume density of the silver particles in each resin was adjusted such that the low volume density was 55% before hardening and was 57% after hardening, and the high volume density was 85% before hardening and was 95% after hardening. Further, the applied amount of each resin was adjusted such that the distance between the metallic wire 101-1 and the second electrode 102 became nearly equal to that described in Example 1, and the thickness of the low volume density portion became nearly equal to that of the high volume density portion.

It is apparent that, in the joint portion thus formed between the metallic wire 101-1 of each first electrode 101 and the second electrode 102, the volume density 103-1 in the neighborhood of the surface of the metallic wire becomes smaller than that in the neighborhood of the second electrode as shown in the enlarged cross-section of FIG. 3.

Evaluation

For the 100 photovoltaic elements obtained in this example, the average initial photoelectric conversion efficiency and the average photoelectric conversion efficiency after the endurance were measured in the same manner as Example 1. As a result, the average initial photoelectric conversion efficiency was 10.1% and the average photoelectric conversion efficiency after the endurance was 9.99%.

COMPARATIVE EXAMPLE 1

Figure 4:
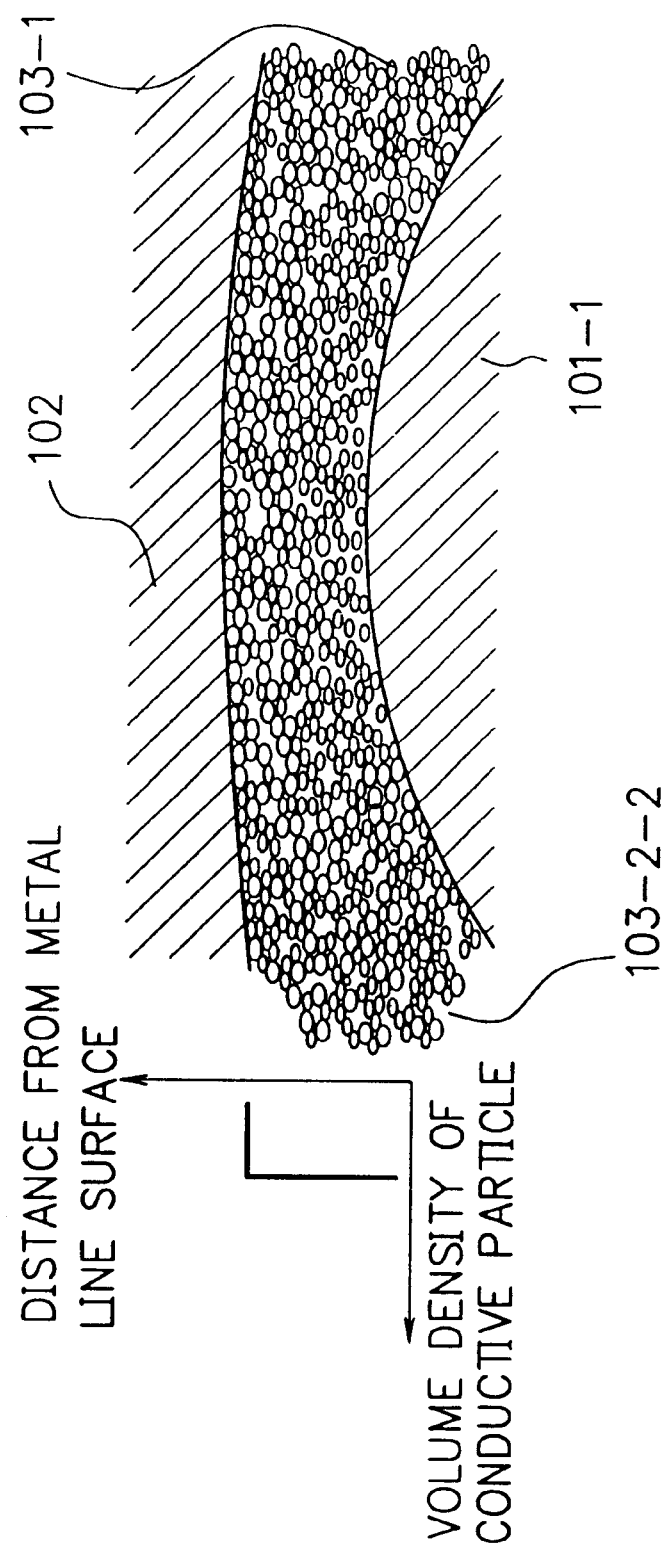
FIG. 4 is a schematic cross-sectional view illustrating an electrode structure of a photovoltaic element in Comparative Example 1 which will be described later.

FIG. 4 is a sectional view of a detailed structure of a photovoltaic element in this comparative example. This comparative example is basically the same as Example 2, except for the following points. That is, a silver paste containing low volume density silver particles was applied only once in place of applying the silver paste containing the low volume density silver particles and the silver paste containing the high volume density silver particles in Example 2.

Concretely, a portion of each first electrode was irradiated with the laser beam; a resin containing silver particles 103-1 at a low volume density was applied to the portion irradiated with the laser beam; the second electrode 102 was placed on the resin applied portion; and the resin was hardened in the same manner as that described in Example 1. A joint portion between each first electrode and the second electrode was thus formed. The kinds of the resin and the silver particles used here are the same as those of the resin and the silver particles used in each of Example 1 and Example 2. The applied amount of the resin containing the silver particles was adjusted such that the distance between each metallic wire 101-1 and the second electrode 102 became nearly equal to that in Example 2.

It is apparent that, in the joint portion thus formed between the metallic wire 101-1 of each first electrode and the second electrode 102, the volume density of the conductive particles 103-1 becomes nearly uniform as shown by the enlarged cross-section of FIG. 4.

Evaluation

For the 100 photovoltaic elements obtained in this comparative example, the average initial photoelectric conversion efficiency and the average photoelectric conversion efficiency after the endurance were measured in the same manner as in Example 1. As a result, the average initial photoelectric conversion efficiency was 9.02% and the average photoelectric conversion efficiency after the endurance was 9.00%.

COMPARATIVE EXAMPLE 2

Figure 5:
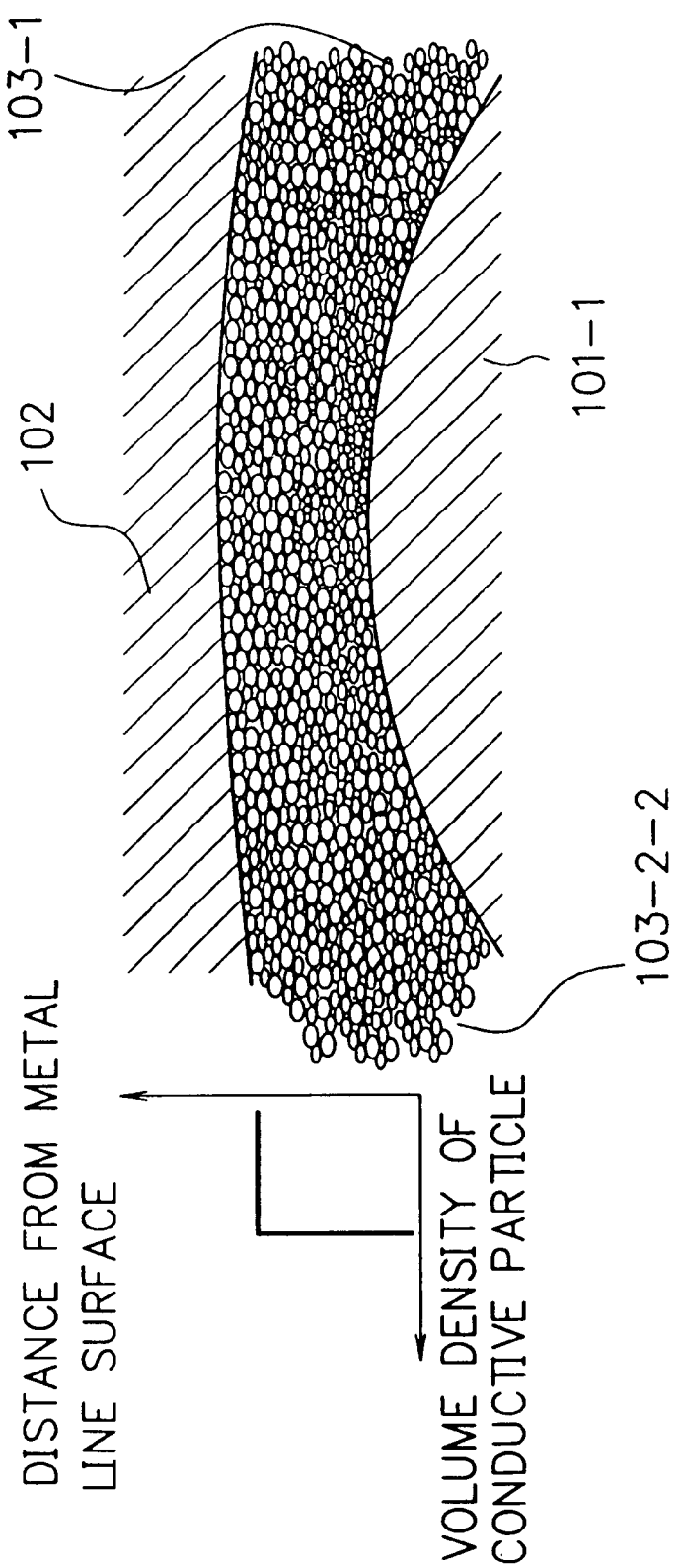
FIG. 5 is a schematic cross-sectional view illustrating an electrode structure of a photovoltaic element in Comparative Example 2 which will be described later.

FIG. 5 is a sectional view of a detailed structure of a photovoltaic element in this comparative example. This comparative example is basically the same as Example 2, except for the following points. That is, a silver paste containing high volume density silver particles was applied only once in place of applying the silver paste containing the low volume density silver particles and the silver paste containing the high volume density silver particles in Example 2.

Concretely, a portion of each first electrode was irradiated with the laser beam; a resin containing silver particles 103-1 at a high volume density was applied to the portion irradiated with the laser beam; the second electrode 102 was placed on the resin applied portion; and the resin was hardened in the same manner as that described in Example 1. A joint portion between each first electrode and the second electrode was thus formed. The kinds of the resin and the silver particles used here are the same as those of the resin and the silver particles used in each of Example 1 and Example 2. The applied amount of the resin containing the silver particles was adjusted such that the distance between each metallic wire 101-1 and the second electrode 102 became nearly equal to that in Example 2.

It is apparent that, in the joint portion thus formed between the metallic wire 101-1 of each first electrode and the second electrode 102, the volume density of the conductive particles 103-1 becomes nearly uniform as shown by the enlarged cross-section of FIG. 5.

Evaluation

For the 100 photovoltaic elements obtained in this comparative example, the average initial photoelectric conversion efficiency and the average photoelectric conversion efficiency after the endurance were measured in the same manner as Example 1. As a result, the average initial photoelectric conversion efficiency was 10.0% and the average photoelectric conversion efficiency after the endurance was 9.50%. Further, as a result of analysis of the joint portion between the metallic wire 101-1 and the second electrode 102 of each photovoltaic element after the endurance, it was found that the joint portions of about 50 of the 100 photovoltaic elements were broken or peeled.

Table 1 shows the evaluated results in Examples 1 and 2 and Comparative Examples 1 and 2.

From the results shown in Table 1, it is understood that in each of Examples 1 and 2, the average initial photoelectric conversion efficiency and the average photoelectric conversion efficiency after the endurance are both desirable. On the contrary, the average initial photoelectric conversion efficiency in Comparative Example 1 is already apparently inferior to that in each of Examples 1 and 2. The reason for this is considered such that since the volume density of the silver particles in the joint portion in Comparative Example 1 is smaller in the neighborhood of the second electrode as compared with that in the joint portion in each of Examples 1 and 2 and because of this, the electrical resistance of the joint portion in Comparative Example 1 becomes larger than that of the joint portion in each of Examples 1 and 2.

In Comparative Example 2, the average initial photoelectric conversion efficiency is comparable to that in each of Examples 1 and 2, however, the average photoelectric conversion efficiency after the endurance is apparently inferior that in each of Examples 1 and 2. Accordingly, it is understood that the stress resistance of the photovoltaic element in each of Examples 1 and 2 is superior to that of the photovoltaic element in Comparative Example 2. The reason for this is considered such that since the volume density of the silver particles in the joint portion in Comparative Example 2 is larger in the neighborhood of the first electrode as compared with that in the joint portion in each of Examples 1 and 2, and because of this, the strength of a portion of the joint portion which is situated in the vicinity of the first electrode in Comparative Example 2 becomes smaller than that of the joint portion in each of Examples 1 and 2. Further, from the results shown in Table 1, it is understood that the present invention exhibits superior effects.

TABLE 1

|  | average initial photoelectric conversion efficiency | average photoelectric conversion efficiency after the endurance | total evaluation |
| --- | --- | --- | --- |
| Inventive example 1 | 10.7 | 10.5 | Good |
| Inventive example 2 | 10.1 | 9.99 | Good |
| Comparative example 1 | 9.02 | 9.00 | Bad |
| Comparative example 2 | 10.0 | 9.50 | Bad |

EXAMPLE 3

In this example, the procedures of Example 1 were repeated, except that the volume density of the carbon black powder as the filler in the resin was changed from 35% (the value in Example 1) to 15%, 20%, 25%, 45%, 50%, and 55%, to obtain a number of photovoltaic elements in each case.

Particularly, in each case where the volume density of the carbon black powder to the prescribed value, a mottled cover portion was formed, and as the amount of the filler became larger, the adhesively bonded area between the first resin and the metallic wire became smaller and the amount of the residue of the first resin after the irradiation of the laser beam became smaller, with a result that the covering area of the mottled cover portion became smaller.

Evaluation

For the photovoltaic elements obtained in this example, the average initial photoelectric conversion efficiency and the average photoelectric conversion efficiency after the endurance were measured in the same manner as in Example 1. As a result, when the volume density of the filler was 15%, the average initial photoelectric conversion efficiency was 8.4% and the average photoelectric conversion efficiency after the endurance was 8.2%; when the volume density of the filler was 20%, the average initial photoelectric conversion efficiency was 9.8% and the average photoelectric conversion efficiency after the endurance was 9.6%; when the volume density of the filler was 25%, the average initial photoelectric conversion efficiency was 10.5% and the average photoelectric conversion efficiency after the endurance was 10.4%; when the volume density of the filler was 45%, the average initial photoelectric conversion efficiency was 10.7% and the average photoelectric conversion efficiency after the endurance was 10.4%; when the volume density of the filler was 50%, the average initial photoelectric conversion efficiency was 10.8% and the average photoelectric conversion efficiency after the endurance was 9.7%; and when the volume density of the filler was 55%, the average initial photoelectric conversion efficiency was 10.9% and the average photoelectric conversion efficiency after the endurance was 8.5%.

Figure 6:
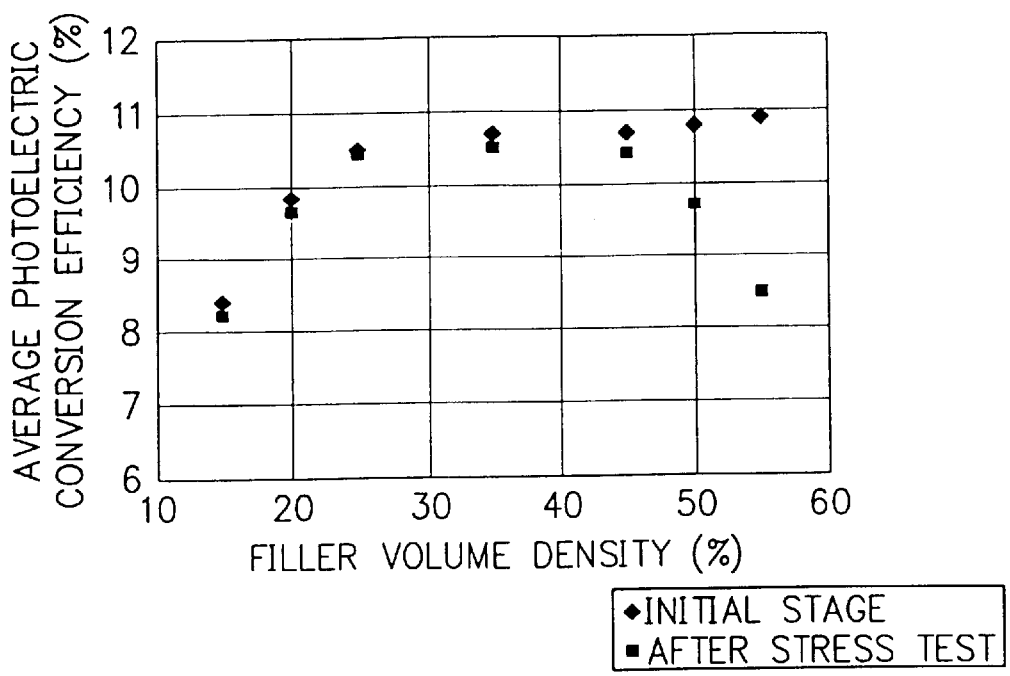
FIG. 6 is a graph collectively showing the results obtained in Examples 1 and 3 which will be described later.

The evaluated results obtained in Examples 1 and 3 are graphically shown in FIG. 6. From the graph shown in FIG. 6, it is understood that, in the case of applying the resin containing the filler on the surface of the metallic wire and forming the mottled cover portion on the surface of the metallic wire by irradiation of an energy beam, it is preferable that the volume density of the filler in the resin is made to fall in a range of 20 to 50%.

EXAMPLE 4

In this example, the procedures of Example 1 were repeated, except that the average output of the YAG laser beam was changed from 31 W (the value in Example 1) to 15 W, 20 W, 25 W, 45 W, 50 W, and 55 W, to obtain a number of photovoltaic elements in each case.

Evaluation

For the photovoltaic elements obtained in this example, the average initial photoelectric conversion efficiency and the average photoelectric conversion efficiency after the endurance were measured in the same manner as in Example 1. As a result, when the average output of the laser beam was 15W, the average initial photoelectric conversion efficiency was 6.8% and the average photoelectric conversion efficiency after the endurance was 6.6%; when the average output of the laser beam was 20 W, the average initial photoelectric conversion efficiency was 9.5% and the average photoelectric conversion efficiency after the endurance was 9.1%; when the average output of the laser beam was 25 W, the average initial photoelectric conversion efficiency was 10.4% and the average photoelectric conversion efficiency after the endurance was 10.3%; when the average output of the laser beam was 45 W, the average initial photoelectric conversion efficiency was 10.8% and the average photoelectric conversion efficiency after the endurance was 10.4%; when the average output of the laser beam was 50 W, the average initial photoelectric conversion efficiency was 10.8% and the average photoelectric conversion efficiency after the endurance was 9.8%; and when the average output of the laser beam was 55 W, the average initial photoelectric conversion efficiency was 10.8% and the average photoelectric conversion efficiency after the endurance was 8.2%.

Figure 7:
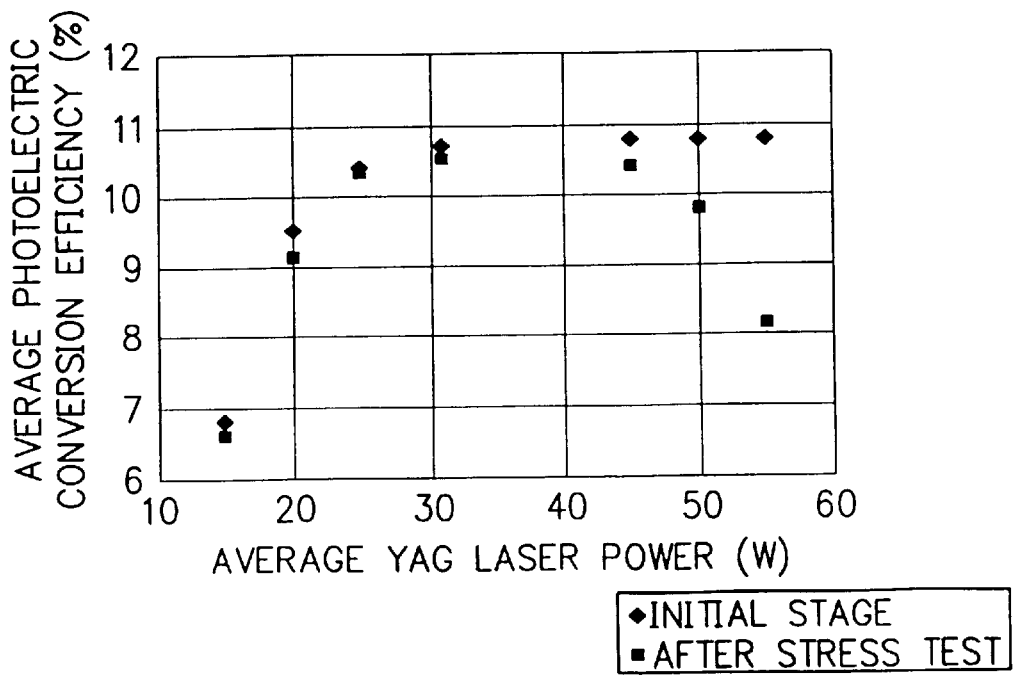
FIG. 7 is a graph collectively showing the results obtained in Examples 1 and 4 which will be described later.
Figure 8:
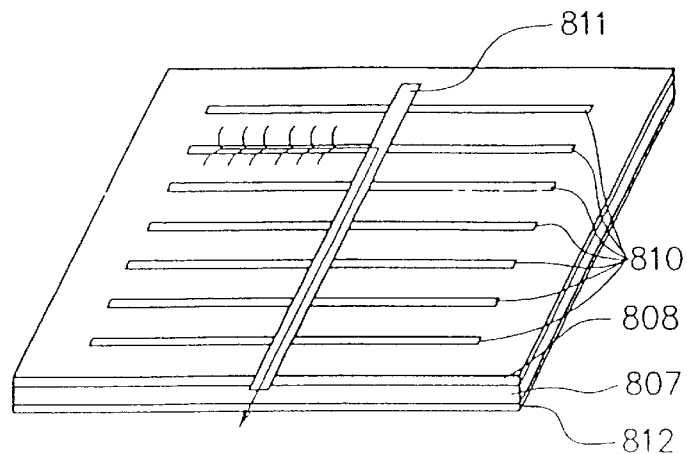
FIG. 8 is a schematic view illustrating an example of a conventional photovoltaic element.

The evaluated results obtained Examples 1 and 4 are graphically shown in FIG. 7. From the graph shown in FIG. 7, it is understood that, in the case of applying the resin containing the filler on the surface of the metallic wire and forming the mottled cover portion on the surface of the metallic wire by irradiation of the pulse YAG laser beam, the average output by Q-switching oscillation is preferred to fall in a range of from 20 W to less than 50 W.

As described above, according to the present invention, it is possible to enhance the stress resistance of a photovoltaic element having an electrode connection portion (or an electrode joining portion) between an electrode formed of a metallic wire and another electrode.

What is claimed is:

1. A photovoltaic device comprising:
   a substrate having a photovoltaic layer thereon;
   a first electrode which is arranged on said substrate, said first electrode comprising a metallic wire having a cover formed of a resin and first conductive particles where said metallic wire has a portion free of said cover;
   a second electrode comprising a bus bar electrode connected to said first electrode such that said portion is positioned between said metallic wire constituting said first electrode and said second electrode; and
   said portion having second conductive particles and a resin provided therein,
   wherein a volume density of said second conductive particles is decreased in a direction from a surface of said second electrode to a surface of said metallic wire constituting said first electrode, and
   wherein a volume density of said first conductive particles in said cover is smaller than that of said second conductive particles in said portion.

2. A photovoltaic device according to claim 1, wherein said resin in said portion comprises a first resin and a second resin, where said first resin is arranged on the surface of said metallic wire constituting said first electrode in a mottled pattern, and said second resin is arranged to cover said first resin.

3. A photovoltaic device according to claim 2, wherein said second resin mainly contains a cross-linked acrylic ester.

4. A photovoltaic device comprising:
   a first electrode comprising a metallic wire,
   a second electrode connected to said first electrode, and
   a joint portion composed of conductive particles and a resin, said joint portion being arranged between said metallic wire constituting said first electrode and said second electrode,
   wherein a volume density of said conductive particles in said joint portion is decreased in a direction from a surface of said second electrode to a surface of said metallic wire constituting said first electrode, and
   wherein said joint portion is composed of said conductive particles, a first resin for covering the surface of said metallic wire constituting said first electrode in a mottled pattern, and a second resin for covering said first resin, and said first resin mainly contains a cross-linked butyral resin.

5. A process for producing a photovoltaic device which has a substrate having a photovoltaic layer thereon; a first electrode which is arranged on said substrate, said first electrode comprising a metallic wire; a second electrode comprising a bus bar electrode connected to said first electrode; and a joint portion composed of conductive particles and a resin, said joint portion being arranged between said metallic wire constituting said first electrode and said second electrode; wherein a volume density of the conductive particles in the joint portion is decreased in a direction from a surface of the second electrode to a surface of the metallic wire constituting the first electrode, said process including the steps of:

disposing a resin (A) containing said conductive particles dispersed therein at a volume density (A-i), and stacking a resin (B) containing said conductive particles dispersed therein at a volume density (B-i) which is greater than said volume density (A-i) of the conductive particles contained in said resin (A), on said resin (A), to form said joint portion, wherein said metallic wire as said first electrode comprises a metallic wire having a cover formed of a resin, wherein said cover is partially removed to form portions free of said cover at a surface of said metallic wire before the resin (A) is disposed, and the resin (A) is disposed on said portions of the surface of said metallic wire.

6. The process according to claim 5, wherein prior to stacking said resin (B), said resin (A) is disposed and is hardened.

7. The process according to claim 5, wherein the partial removal of the cover is performed by irradiating laser beam to a desired portion of said cover.

8. A process for producing a photovoltaic device having a first electrode comprising a metallic wire, a second electrode connected to said first electrode, and a joint portion composed of conductive particles and a resin, said joint portion being arranged between said metallic wire constituting said first electrode and said second electrode, wherein a volume density of said conductive particles in said joint portion is decreased in a direction from a surface of the second electrode to a surface of the metallic wire constituting the first electrode, said process including the steps of:

forming a mottled cover portion covering the surface of the metallic wire in a mottled pattern, and disposing a resin containing conductive particles such that said resin is in contact with the mottled cover portion, wherein the mottled cover portion is formed by disposing a resin containing a filler on the surface of the metallic wire and irradiating the resin containing the filler with an energy beam.

9. The process according to claim 8, wherein the filler comprises a powdery particulate having an average diameter in a range of 10 to 50 nm.

10. The process according to claim 9, wherein the powdery particulate constituting the filler is contained in the resin at a volume density in a range of 20 to 50%.

11. The process according to claim 8, wherein the filler comprises a powdery carbon black particulate.

12. The process according to claim 8, wherein the resin which contains the filler mainly comprises a cross-linked butyral resin.

13. The process according to claim 8, wherein the energy beam is a pulse YAG laser beam having an average output by Q-switching oscillation in a range of from 20 W to less than 50 W.

14. The process according to claim 8, wherein said metallic wire is a metallic wire having a cover made of a resin wherein said cover of said metallic wire is partially removed to form portions free of said cover at a surface of said metallic wire before the mottled cover portion is formed, and the mottled cover portion is formed on said portions of the surface of said metallic wire.

15. The process according to claim 14, wherein the removal of the cover is performed by means of laser irradiation.

* * * * *